US008748948B2

(12) United States Patent
Malhan

(10) Patent No.: US 8,748,948 B2
(45) Date of Patent: Jun. 10, 2014

(54) SIC SEMICONDUCTOR DEVICE HAVING CJFET AND METHOD FOR MANUFACTURING THE SAME

(75) Inventor: Rajesh Kumar Malhan, Nagoya (JP)

(73) Assignee: DENSO CORPORATION, Kariya (JP)

( * ) Notice: Subject to any disclaimer, the term of this patent is extended or adjusted under 35 U.S.C. 154(b) by 342 days.

(21) Appl. No.: 13/012,123

(22) Filed: Jan. 24, 2011

(65) Prior Publication Data

US 2011/0198612 A1    Aug. 18, 2011

(30) Foreign Application Priority Data

Feb. 12, 2010   (JP) .................................. 2010-29228

(51) Int. Cl.
*H01L 29/80* (2006.01)
*H01L 31/0312* (2006.01)
(52) U.S. Cl.
USPC ...................... 257/274; 257/77; 257/E29.104
(58) Field of Classification Search
USPC ................................................... 257/77, 274
See application file for complete search history.

(56) References Cited

U.S. PATENT DOCUMENTS

| 6,344,663 | B1 | 2/2002 | Slater, Jr. et al. |
| 6,503,782 | B2 | 1/2003 | Casady et al. |
| 2007/0012946 | A1 | 1/2007 | Sankin et al. |
| 2007/0096144 | A1* | 5/2007 | Kapoor ......................... 257/134 |
| 2010/0090259 | A1* | 4/2010 | Masuda et al. ................ 257/256 |

FOREIGN PATENT DOCUMENTS

| JP | 09301799 A | * 11/1997 | ............. C30B 29/36 |
| JP | A-H09-301799 | 11/1997 | |
| JP | 2000150912 A | * 5/2000 | ............. H01L 29/80 |
| JP | A-2000-150912 | 5/2000 | |
| JP | A-2001-332701 | 11/2001 | |
| JP | 2008153445 A | * 7/2008 | |
| JP | A-2009-514233 | 4/2009 | |
| JP | A-2009-200326 | 9/2009 | |
| WO | WO 2007/053485 | 5/2007 | |

OTHER PUBLICATIONS

Office Action mailed Apr. 10, 2012 in corresponding JP Application No. 2010-029228 (and English translation).

* cited by examiner

*Primary Examiner* — Ha Tran T Nguyen
*Assistant Examiner* — Raj R Gupta
(74) *Attorney, Agent, or Firm* — Posz Law Group, PLC

(57) ABSTRACT

A SiC semiconductor device includes: a SiC substrate made of intrinsic SiC having semi-insulating property; first and second conductive type SiC layers disposed in the substrate; an insulation separation layer made of intrinsic SiC for isolating the first conductive type SiC layer from the second conductive type SiC layer; first and second conductive type channel JFETs disposed in the first and second conductive type SiC layers, respectively. The first and second conductive type channel JFETs provide a complementary junction field effect transistor. Since an electric element is formed on a flat surface, a manufacturing method is simplified. Further, noise propagation at high frequency and current leakage at high temperature are restricted.

7 Claims, 18 Drawing Sheets

SIC SEMICONDUCTOR DEVICE HAVING CJFET AND METHOD FOR MANUFACTURING THE SAME

CROSS REFERENCE TO RELATED APPLICATION

This application is based on Japanese Patent Application No. 2010-29228 filed on Feb. 12, 2010, the disclosure of which is incorporated herein by reference.

FIELD OF THE INVENTION

The present invention relates to a SiC semiconductor device having a CJFET (complementary junction type field effect transistor) and a method for manufacturing a SiC semiconductor device with CJFET.

BACKGROUND OF THE INVENTION

Conventionally, a vertical CJFET made of SIC substrate includes a N channel JFET and a P channel JFET. The SiC material has semi-insulating (i.e., SI) property. The CJFET is disclosed in, for example, U.S. Pat. No. 6,503,782 and US 2007/0012946. In the CJFET, an impurity layer formed on the SiC substrate is divided by a trench etching method so that the N channel JFET region and the P channel JFET region are separated from each other. Thus, the N channel JFET region is isolated from the P channel JFET region.

Further, a vertical type CMOS transistor made of a SiC substrate is disclosed in, for example, U.S. Pat. No. 6,344,663. In the CMOS transistor, a PN separation technique is used, so that the N channel MOS transistor and the P channel MOS transistor are isolated from each other.

However, in the above cases, when the N channel JFET and the P channel JFET are isolated from each other by a trench etching method, an etched region provides a trench, which remains on the surface of the substrate. Thus, manufacturing steps are complicated since the surface of the substrate includes a step. For example, when an impurity layer is formed by an ion implantation method, it is difficult to form a mask because of the step on the surface of the substrate. Further, when a wiring layer is formed, the wiring layer is patterned under a condition that the wiring layer is disposed on the step. Thus, comparing with a case where the wiring layer is formed on a flat surface of the substrate, a manufacturing process is made difficult. Accordingly, it is required to provide a device having a flat surface without any step.

Since a structure shown in U.S. Pat. No. 6,344,663 provides isolation between the N channel MOS transistor and the P channel MOS transistor, an electric element can be formed on a flat surface of the substrate. However, when the device is used with high frequency, a noise may be transmitted. Further, when the device is used at high temperature, a current may be leaked.

Regarding a silicon based device, a trench separation structure is formed with using a SOI substrate. Thus, a trench is formed on a silicon layer to reach the embedded insulation film. When an insulation film is embedded in the trench, an element separation structure is formed by the insulation film in the trench. However, regarding a SiC based device, it is necessary to perform a high temperature step such as an activation step for an impurity. Thus, an insulation film such as an oxide film may be deformed in the high temperature step. Thus, it is difficult to apply the above technique in the silicon based device.

SUMMARY OF THE INVENTION

In view of the above-described problem, it is an object of the present disclosure to provide a SIC semiconductor device having a CJFET. It is another object of the present disclosure to provide a method for manufacturing a SIC semiconductor device with CJFET. The CJFET has an insulation separation structure. A noise transmission at high frequency and current leakage at high temperature are reduced.

According to a first aspect of the present disclosure, a SiC semiconductor device includes: a SiC substrate made of intrinsic SiC having semi-insulating property and including a first surface; a first conductive type SiC layer disposed in a surface portion of the substrate on the first surface; a second conductive type SiC layer disposed in another surface portion of the substrate on the first surface; an insulation separation layer made of intrinsic SIC for isolating the first conductive type SiC layer from the second conductive type SIC layer, wherein the insulation separation layer extends along with a first direction perpendicular to the first surface of the substrate; a first conductive type channel JFET disposed in one of the first conductive type SiC layer and the second conductive type SiC layer; and a second conductive type channel JFET disposed in the other of the first conductive type SiC layer and the second conductive type SiC layer. The first conductive type channel JFET and the second conductive type channel JFET provide a complementary junction field effect transistor.

In the above device, the insulation separation layer isolates the first conductive type SiC layer from the second conductive type SiC layer, so that an electric element in the complementary junction field effect transistor is formed on a flat surface of the substrate. The manufacturing method of the device is simplified. Further, the insulation separation layer is made of an intrinsic SiC layer having the semi-insulating property instead of a PN junction separation, and therefore, high frequency noise is absorbed in the insulation separation layer so that noise propagation at high frequency is restricted. Further, current leakage at high temperature is restricted.

According to a second aspect of the present disclosure, a manufacturing method of the SiC semiconductor device according to the first aspect of the present disclosure includes: forming an isolation structure such that the first conductive type SiC layer is isolated from the second conductive type SIC layer. The forming of the isolation structure includes: forming the first conductive type SiC layer on the first surface of the substrate; etching a part of the first conductive type SiC layer, which is disposed at an insulation-separation-layer-to-be-formed region and a second-conductive-type-SiC-layer-to-be-formed region, so that a trench is formed; depositing the insulation separation layer on a surface of the first conductive type SiC layer and an inner wall of the trench; forming the second conductive type SiC layer on a surface of the insulation separation layer; and flattening the second conductive type SiC layer and the insulation separation layer until the first conductive type SiC layer is exposed from the second conductive type SiC layer and the insulation separation layer.

In the above method, the insulation separation layer isolates the first conductive type SiC layer from the second conductive type SiC layer, so that an electric element in the complementary junction field effect transistor is formed on a flat surface of the substrate. The manufacturing method of the device is simplified. Further, the insulation separation layer is made of an intrinsic SiC layer having the semi-insulating property instead of a PN junction separation, and therefore, high frequency noise is absorbed in the insulation separation layer so that noise propagation at high frequency is restricted. Further, current leakage at high temperature is restricted.

According to a third aspect of the present disclosure, a manufacturing method of the SiC semiconductor device according to the first aspect of the present disclosure includes: forming an isolation structure such that the first conductive type SiC layer is isolated from the second conductive type SiC layer. The forming of the isolation structure includes: forming a trench on the first surface of the substrate at a first-conductive-type-SiC-layer-to-be-formed region; forming the first conductive type SiC layer on the first surface of the substrate and an inner wall of the trench; flattening the first conductive type SiC layer until the first conductive type SiC layer is disposed only in the trench; and implanting an ion on the first surface of the substrate at a second-conductive-type-SiC-layer-to-be-formed region so that the second conductive type SiC layer is formed in a part of the substrate, and another part of the substrate between the first conductive type SIC layer and the second conductive type SiC layer remains without implanting the ion. The another part of the substrate provides the insulation separation layer.

In the above method, the insulation separation layer isolates the first conductive type SiC layer from the second conductive type SiC layer, so that an electric element in the complementary junction field effect transistor is formed on a flat surface of the substrate. The manufacturing method of the device is simplified. Further, the insulation separation layer is made of an intrinsic SiC layer having the semi-insulating property instead of a PN junction separation, and therefore, high frequency noise is absorbed in the insulation separation layer so that noise propagation at high frequency is restricted. Further, current leakage at high temperature is restricted.

BRIEF DESCRIPTION OF THE DRAWINGS

The above and other objects, features and advantages of the present invention will become more apparent from the following detailed description made with reference to the accompanying drawings. In the drawings:

FIG. 2 is a diagram showing a top view of the SiC semiconductor device in

FIG. 1;

DETAILED DESCRIPTION OF THE PREFERRED EMBODIMENTS (First Embodiment)

Figure 1:
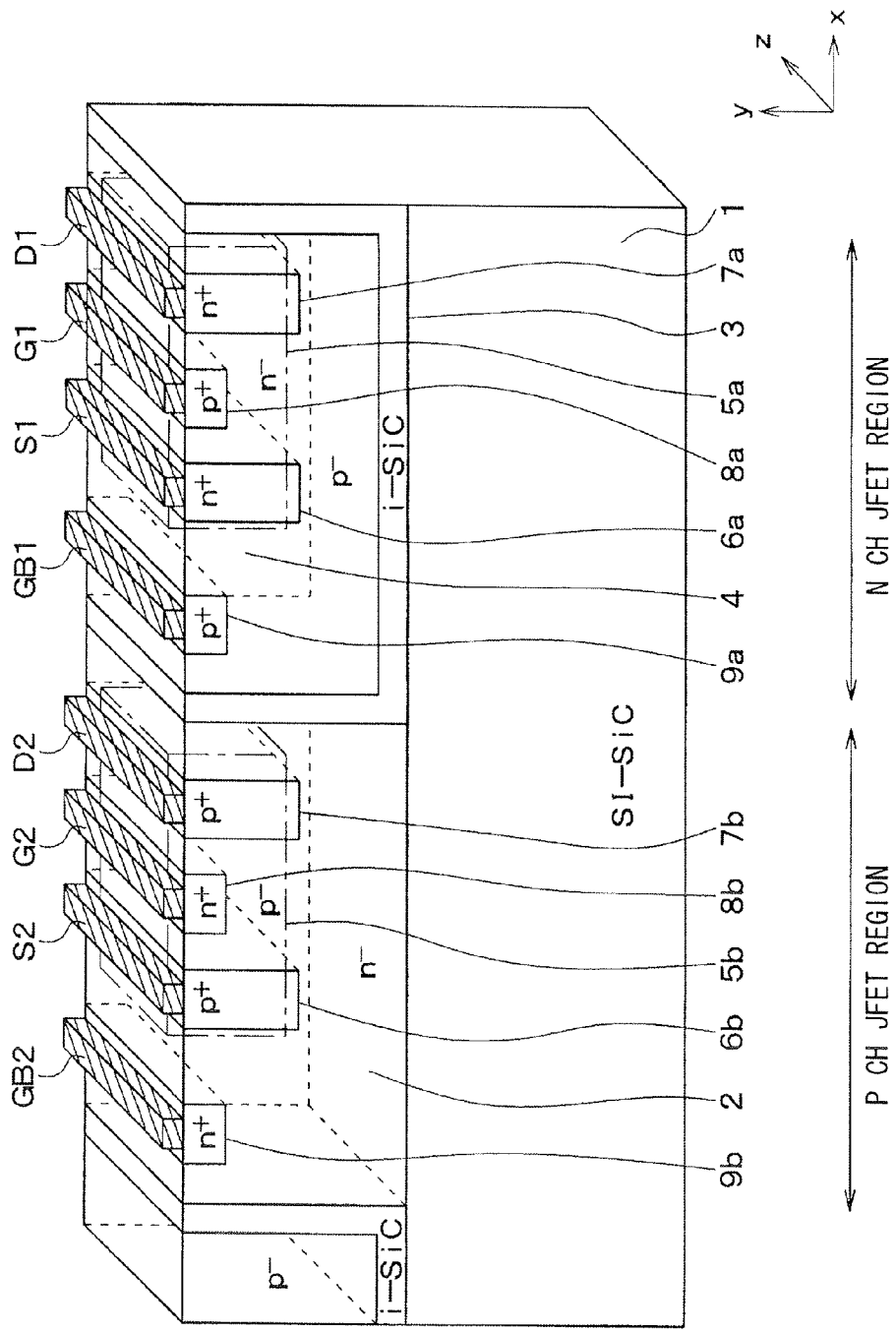
FIG. 1 is a diagram showing a SiC semiconductor device having a CJFET according to a first embodiment.
Figure 2:
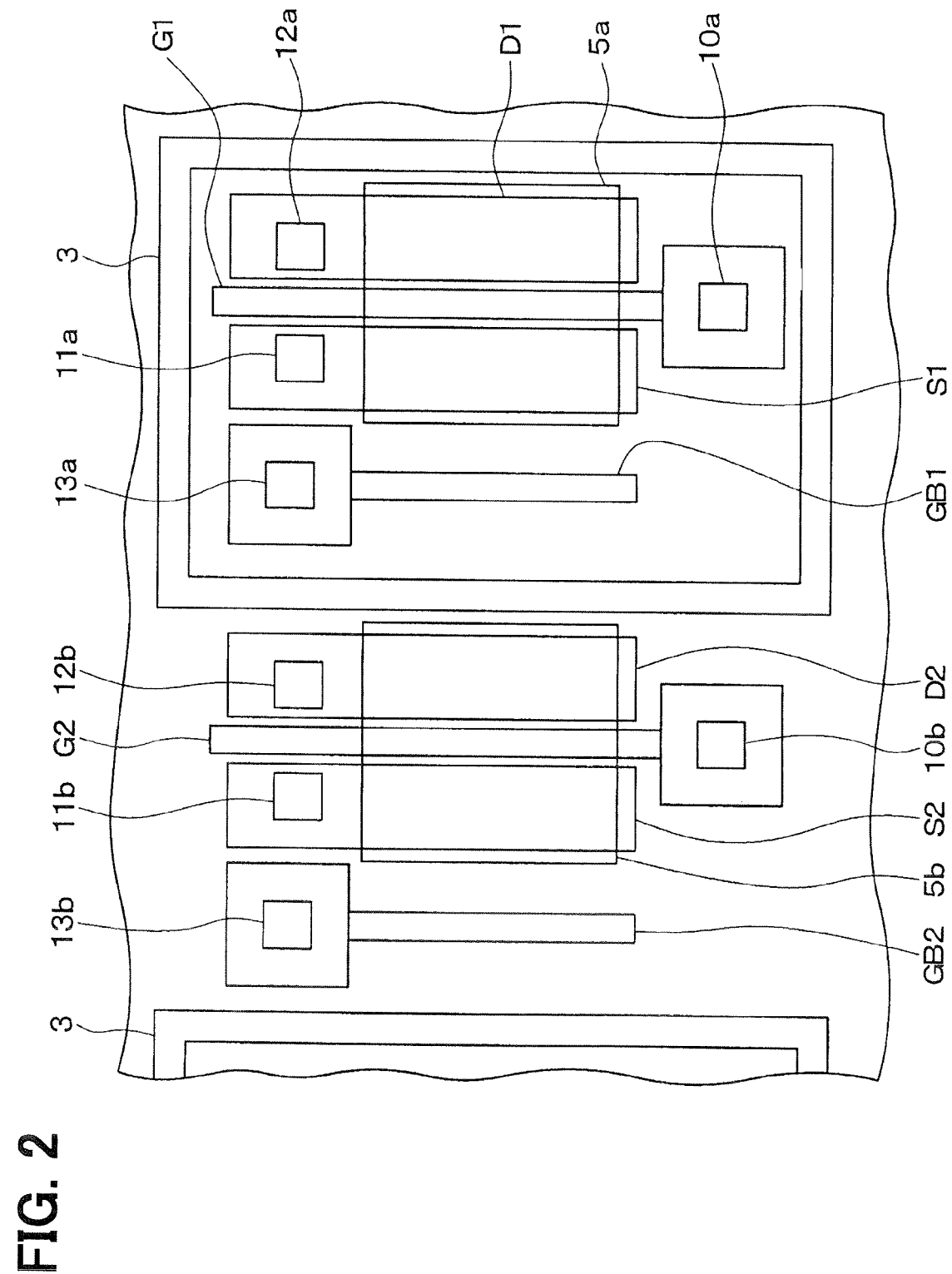

A SiC semiconductor device according to a first embodiment will be explained. FIG. 1 shows the SiC semiconductor device having a CJFET. FIG. 2 is a layout view of the SiC semiconductor device. A structure of the CJFET in the device will be explained as follows. In FIG. 1, a right-left direction of the drawing is defined as X direction, an up-down direction of the drawing is defined as a Y direction, and a direction perpendicular to the X and Y directions is defined as Z direction.

The SiC semiconductor device is made of a SiC substrate 1 having semi-insulating property ('i.e., SI-SiC substrate). The semi-insulating property is provided by a non-doped semiconductor material having resistivity or conductivity near insulation material. For example, in the present embodiment, the SiC substrate 1 having semi-insulating property is an offset substrate made of 4H-SiC. A principal surface of the substrate 1 has an offset angle with respect to a (0001)-Si surface or a (000-1)-C surface. The resistivity of the substrate 1 is in a range between $1 \times 10^{10}$ ohm-centimeters and $1 \times 10^{11}$ ohm-centimeters. A thickness in the Y direction is in a range between 50 and 400 micrometers. Typically, the thickness of the substrate 1 is 350 micrometers.

The SiC substrate 1 is divided into a N channel JFET region and a P channel JFET region. In the P channel JFET region, a N conductive type SiC layer 2 is formed on the principal surface of the substrate 1. The SIC layer 2 has an N conductive type impurity concentration in a range between $1 \times 10^{15}$ cm$^{-3}$ and $1 \times 10^{17}$ cm$^{-3}$. Specifically, the impurity concentration of the SiC layer 2 is $1 \times 10^{17}$ cm$^{-3}$. A thickness of the SiC layer 2 in the Y direction is in a range between 1.0 and 4.0 micrometers. For example, the thickness of the Sic layer 2 is 1.0 micrometer.

An insulation separation layer 3 is formed between the N channel JFET region and the p channel JFET region. The insulation separation layer 3 extends from the principal surface of the substrate along with the Y direction, and disposed on the principal surface of the substrate 1 in the N channel JFET region. The insulation separation layer 3 is made of an intrinsic SiC (i.e., i-SiC) film. Specifically, the insulation separation layer 3 is disposed on a sidewall of the SiC layer 2, and further, disposed on the principal surface of the substrate 1, on which the SiC layer 2 is not formed. A P conductive type SiC layer 4 is surrounded with the insulation separation layer 3. The insulation separation layer 3 is made of i-SiC having semi-insulating property. The impurity concentration of the insulation separation layer 3 is in a range between $1 \times 10^{11}$ cm$^{-3}$ and $1 \times 10^{14}$ cm$^{-3}$. Typically, the impurity concentration of the insulation separation layer 3 is $1 \times 10^{17}$ cm$^{-3}$. A thickness of the insulation separation layer 3 on the sidewall of the SiC layer 2 along with the X direction and a thickness of the insulation layer 3 on the principal surface of the substrate 1 along with the Y direction are in a range between 0.1 and 2.0 micrometers. Typically, the thickness of the insulation separation layer along with the X and Y directions is 0.5 micrometers. The P conductive type SiC layer 4 has a P conductive type impurity concentration in a range between $1 \times 10^{15}$ cm$^{-3}$ and $1 \times 10^{17}$ cm$^{-3}$. A thickness of the P conductive type SIC layer 4 is equal to a difference between a thickness of the N conductive type SiC layer 2 and a thickness of the insulation separation layer 3.

A N conductive type channel layer 5a is formed in a surface portion of the P conductive type SiC layer 4. The channel layer 5a is disposed from the surface of the P conductive type SIC layer 4 to a predetermined depth position. The channel layer 5a has a N conductive type impurity concentration in a range between $1 \times 10^{16}$ cm$^{-3}$ and $1 \times 10^{18}$ cm$^{-3}$. Typically, the impurity concentration of the channel layer 5a is $1 \times 10^{17}$ cm$^{-3}$. A thickness of the channel layer 5a is in a range between 0.2 and 1.0 micrometers. Typically, the thickness of the channel layer 5a is 0.6 micrometers.

In a region of the P conductive type SiC layer 4 in which the channel layer 5a is formed, a N conductive type source region 6a and a N conductive type drain region 7a are formed to be separated from each other. The source region 6a and the drain region 7a may be disposed within the channel layer 5a. In the present embodiment, the source region 6a and the drain region 7a are formed to be deeper than the channel layer 5a in the Y direction. Further, the length of each of the source region 6a and the drain region 7a is larger than the channel layer along with the Z direction. Each of the source region 6a and the drain region 7a has a N conductive type impurity concentration in a range between $1 \times 10^{18}$ cm$^{-3}$ and $1 \times 10^{20}$ cm$^{-3}$. Typically, the impurity concentration in the source region 6a and the drain region 7a is $2 \times 10^{19}$ cm$^{-3}$. A thickness of each of the source region 6a and the drain region 7a is in a range between 0.1 and 1.0 micrometers. Typically, the thickness of the source region 6a and the drain region 7a is 0.7 micrometers.

A P conductive type gate region 8a is formed in the region of the P conductive type SiC layer 4, in which the N conductive type channel layer 5a is formed. The gate region 8a is disposed between the source region 6a and the drain region 7a. The gate region 8a is spaced apart from the source region 6a and the drain region 7a. Further, the depth of the gate region 8a in the Y direction is shallower than the channel layer 5a. The gate region 8a has a P conductive type impurity concentration in a range between $1 \times 10^{18}$ cm$^{-3}$ and $1 \times 10^{20}$ cm$^{-3}$. Typically, the impurity concentration of the gate region 8a is $1 \times 10^{19}$ cm$^{-3}$. A thickness of the gate region 8a in the Y direction is in a range between 0.1 and 0.5 micrometers. Typically, the thickness of the gate region 8a is 0.4 micrometers. Since the threshold voltage of the JFET is determined by the thickness of the channel layer 5a, which is disposed under the gate region 8a, the threshold voltage is adjusted to be a predetermined voltage with controlling the depth of the gate region 8a and the depth of the channel layer 5a in the Y direction.

Further, a P conductive type contact region 9a is formed at a position in the P conductive type SiC layer 4 separated from the channel layer 5a. The contact region 9a fixes the potential of the P conductive type SiC layer 4. Thus, the contact region 9a functions as a back gate region. The P conductive type impurity concentration of the contact region 9a is equal to that of the gate region 8a, and the depth of the contact region 9a is equal to that of the gate region 8a. The contact region 9a, the source region 6a, the drain region 7a and the gate region 8a are arranged to have a stripe pattern.

An interlayer insulation film (not shown) is formed on the surface of the P conductive type SiC layer 4. The interlayer insulation film is made of a ONO film, and a thickness of the interlayer insulation film is in a range between 0.1 and 1.0 micrometers. Typically, the thickness of the interlayer insulation film is 0.25 micrometers. A first gate electrode G1 is coupled with the gate region 8a via a contact hole formed in the interlayer insulation film. A first source electrode S1 is coupled with the source region 6a via another contact hole in the interlayer insulation film. A first drain electrode D1 is coupled with the drain region 7a via a contact hole in the interlayer insulation film. A first back gate electrode GB1 is coupled with the contact region 9a via a contact hole in the interlayer insulation film. The first gate electrode G1, the first source electrode S1, the first drain electrode D1 and the first back gate electrode GB1 are retrieved along with the Z direction, as shown in FIG. 2. Each electrode G1, S1, D1, GB1 is electrically coupled with an external terminal via a corresponding pad 10a-13a, which is disposed at a periphery of the substrate 1 in the z direction. Thus, the N channel JFET is formed.

A P conductive type channel layer 5b is formed in a surface portion of the N conductive type SiC layer 2. The channel layer 5b is disposed from the surface of the N conductive type SiC layer 2 to a predetermined depth position. The channel layer 5b has a P conductive type impurity concentration in a range between $1 \times 10^{16}$ cm$^{-3}$ and $1 \times 10^{18}$ cm$^{-3}$. Typically, the impurity concentration of the channel layer 5b is $1 \times 10^{17}$ cm$^{-3}$. A thickness of the channel layer 5b is in a range between 0.2 and 1.0 micrometers. Typically, the thickness of the channel layer 5b is 0.6 micrometers.

In the region of the N conductive type SiC layer 2 in which the channel layer 5b is formed, A P conductive type source region 6b and a P conductive type drain region 7b are formed to be separated from each other. The source region 6b and the drain region 7b may be disposed within the channel layer 5b. In the present embodiment, the source region 6b and the drain region 7b are formed to be deeper than the channel layer 5b in the Y direction. Further, the length of each of the source region 6b and the drain region 7b is larger than the channel layer 5b along with the Z direction. Each of the source region 6b and the drain region 7b has a P conductive type impurity concentration in a range between $1 \times 10^{18}$ cm$^{-3}$ and $1 \times 10^{20}$ cm$^{-3}$. Typically, the impurity concentration in the source region 6b and the drain region 7b is $2 \times 10^{19}$ cm$^{-3}$. A thickness of each of the source region 6b and the drain region 7b is in a range between 0.1 and 1.0 micrometers. Typically, the thickness of the source region 6b and the drain region 7b is 0.7 micrometers.

A N conductive type gate region 8b is formed in the region of the N conductive type SiC layer 2, in which the P conductive type channel layer 5b is formed. The gate region 8b is disposed between the source region 6b and the drain region 7b. The gate region 8b is spaced apart from the source region 6b and the drain region 7b. Further, the depth of the gate region 8b in the Y direction is shallower than the channel layer 5b. The gate region 8b has a N conductive type impurity concentration in a range between $1 \times 10^{18}$ cm$^{-3}$ and $1 \times 10^{20}$ cm$^{-3}$. Typically, the impurity concentration of the gate region 8b is $1 \times 10^{19}$ cm$^{-3}$. A thickness of the gate region 8b in the Y direction is in a range between 0.1 and 0.5 micrometers. Typically, the thickness of the gate region 8b is 0.4 micrometers. Since the threshold voltage of the JFET is determined by the thickness of the channel layer 5b, which is disposed under the gate region 8b, the threshold voltage is adjusted to be a predetermined voltage with controlling the depth of the gate region 8b and the depth of the channel layer 5b in the Y direction.

Further, a N conductive type contact region 9b is formed at a position in the N conductive type SiC layer 2 separated from the channel layer 5b. The contact region 9b fixes the potential of the N conductive type SiC layer 2. Thus, the contact region 9b functions as a back gate region. The N conductive type impurity concentration of the contact region 9b is equal to that of the gate region 8b, and the depth of the contact region 9b is equal to that of the gate region 8b. The contact region 9b, the source region 6b, the drain region 7b and the gate region 8b are arranged to have a stripe pattern.

An interlayer insulation film (not shown) is formed on the surface of the N conductive type SiC layer 2. A second gate electrode G2 is coupled with the gate region 8b via a contact hole formed in the interlayer insulation film. A second source electrode S2 is coupled with the source region 6b via another contact hole in the interlayer insulation film. A second drain electrode D2 is coupled with the drain region 7b via a contact hole in the interlayer insulation film. A second back gate electrode GB2 is coupled with the contact region 9b via a contact hole in the interlayer insulation film. The second gate electrode G2, the second source electrode S2, the second drain electrode D2 and the second back gate electrode GB2 are retrieved along with the Z direction, as shown in FIG. 2. Each electrode G2, S2, D2, GB2 is electrically coupled with an external terminal via a corresponding pad 10b-13b, which is disposed at a periphery of the substrate 1 in the Z direction. Thus, the P channel JFET is formed.

Figure 3:
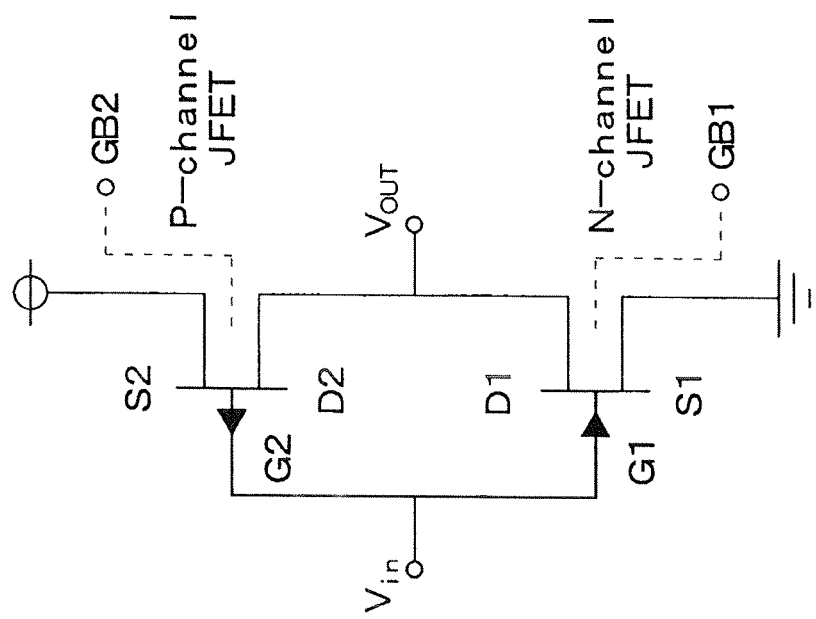
FIG. 3 is a circuit diagram showing the CJFET having a N channel JFET and a P channel JFET.

The CJFET including the N channel JFET and the P channel JFET provides a circuit as shown in FIG. 3.

In the circuit of the CJFET, the first source electrode S1 and the first back gate electrode GB1 of the N channel JFET are grounded. The first drain electrode D1 of the N channel JFET and the second drain electrode D2 of the P channel JFET are coupled with each other. The second source electrode S2 and the second back gate electrode GB2 of the P channel JFET are coupled with a power source. When a gate voltage Vin as an input voltage is input into the first and second gate electrodes G1, G2, a output voltage Vout is output.

In the above circuit, based on the gate voltage Vin applied to the first and second gate electrodes G1, G2, the extending amount of the depletion layer extending from the gate region 8a and the P conductive type SiC layer 4 into the channel layer 5a and the extending amount of the depletion layer extending from the gate region 8b and the N conductive type SiC layer 2 into the channel layer 5b are controlled. When the depletion layers extend widely and sufficiently so that the depletion layers completely pinch off, current between the source and the drain does not flow. When the depletion layers shrink so that the channel region is formed, current between the source and the drain flows. Accordingly, for example, when both of the N channel JFET and the P channel JFET are enhancement type JFETs, and the polarity of the gate voltage Vin is exchanged between a positive voltage and a negative voltage, one of the N channel JFET and the P channel JFET turns on, and the other turns off. Thus, the device controls such that the output voltage Vout shows one of a high level and a low level.

Next, a manufacturing method of the SiC semiconductor device having the CJFET will be explained. FIGS. 4 to 12 show the manufacturing method of the SiC semiconductor device.

Figure 4:
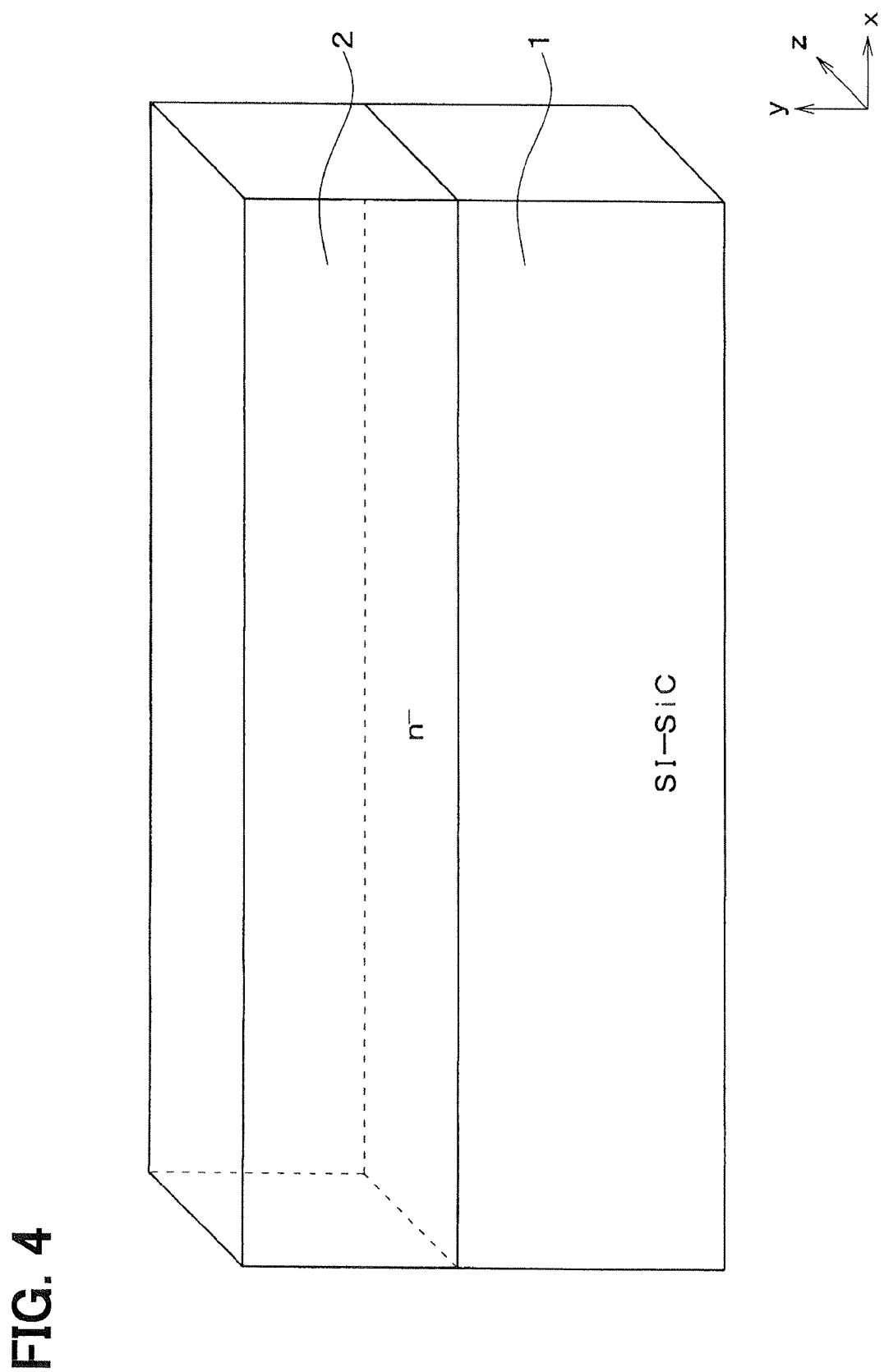
FIGS. 4-12 are diagrams showing a manufacturing method of the SiC semiconductor device in FIG. 1.

<Step in FIG. 4>

Firstly, a SiC substrate 1 having semi-insulating property is prepared. THe principal surface of the substrate 1 has an offset angle with respect to the (0001)-Si surface or the (000-1)-C surface. The substrate is made of an offset substrate of 4H-SiC. The resistivity of the substrate 1 is in a range between $1\times10^{10}$ ohm-centimeters and $1\times10^{11}$ ohm-centimeters. A thickness of the substrate 1 is in a range between 50 and 400 micrometers. For example, the thickness of the substrate 1 is 350 micrometers. A N conductive type SiC layer 2 is epitaxially grown on the principal surface of the substrate 1. The SiC layer 2 has a N conductive type impurity concentration in a range between $1\times10^{15}$ cm$^{-3}$ and $1\times10^{17}$ cm$^{-3}$. For example, the impurity concentration of the SiC layer 2 is $1\times10^{17}$ cm$^{-3}$. The thickness of the SIC layer 2 is in a range between 1.0 and 4.0 micrometers. For example, the thickness of the SIC layer 2 is 1.0 micrometer.

Figure 5:
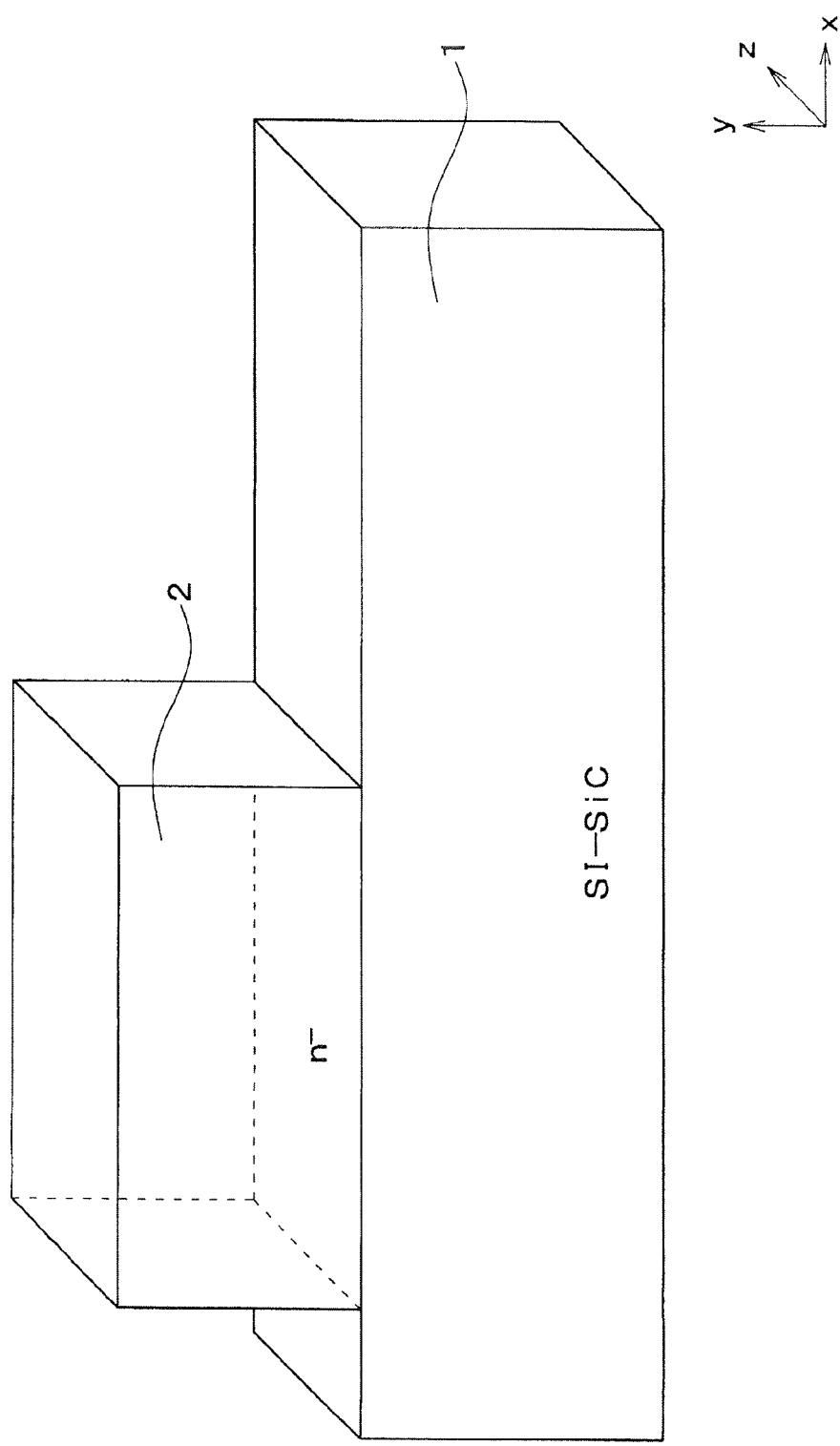

<Step in FIG. 5>

A mask (not shown) made of a LTO film is formed on the surface of the SiC layer 2. Then, a part of the mask for forming the insulation separation layer 3 and the P conductive type SiC layer 4 is opened. Under a condition that the N conductive type SiC layer 2 is covered with the mask, the substrate 1 is etched so that the SiC layer 2 is patterned. Specifically, the SiC layer 2 remains only in the P channel JFET region. Other part of the SiC layer 2 is removed so that a trench is formed. After that, the mask is removed.

Figure 6:
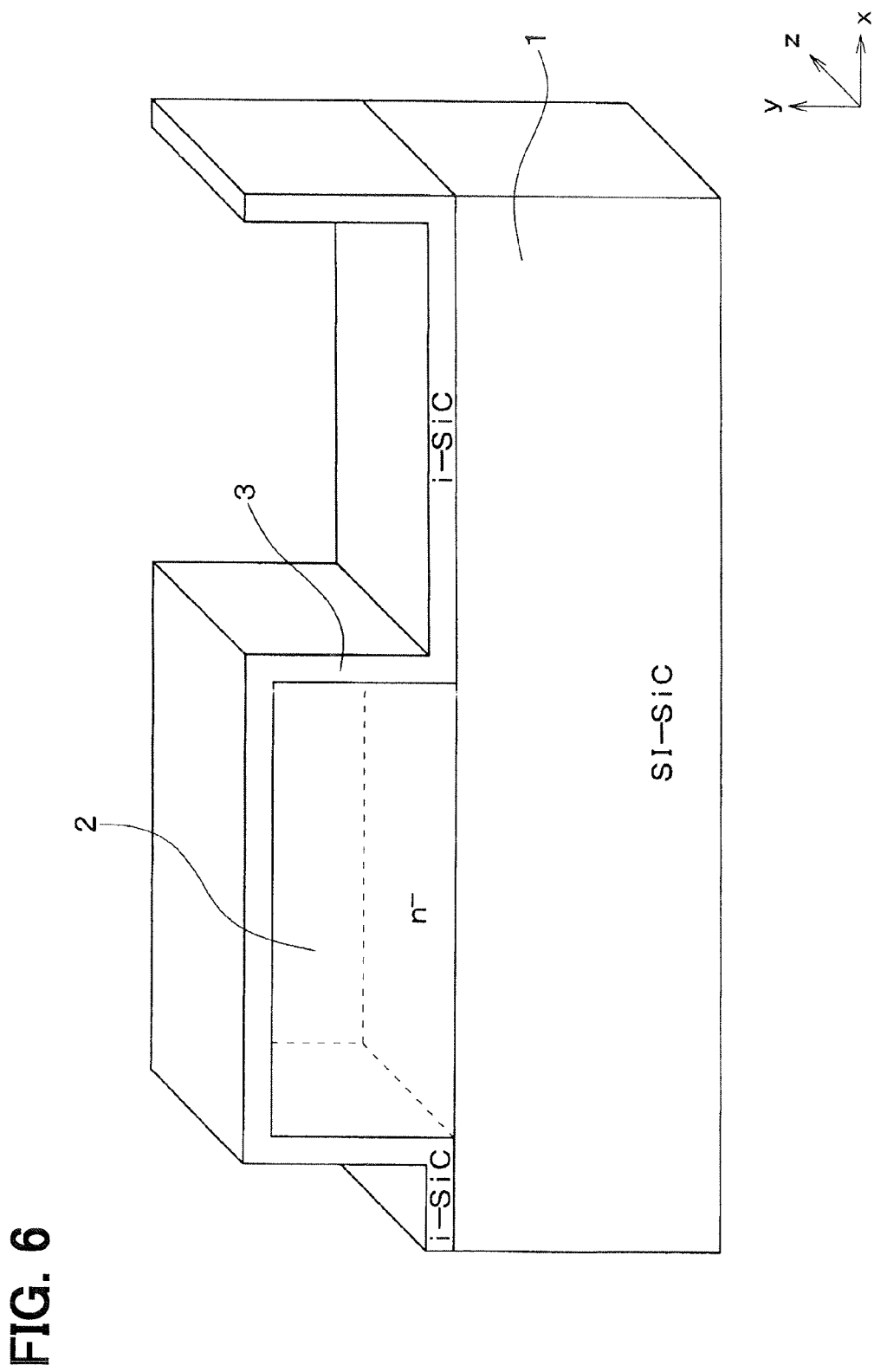

<Step in FIG. 6>

The insulation separation layer 3 made of an i-SiC film is formed on the SiC layer 2 and an inner wall of the trench. The insulation separation layer 3 has an impurity concentration in a range between $1\times10^{11}$ cm$^{-3}$ and $1\times10^{14}$ cm$^{-3}$. For example, the impurity concentration of the insulation separation layer 3 is $1\times10^{12}$ cm$^{-3}$. The thickness of the insulation separation layer 3 in the X direction and the Y direction is in a range between 0.1 and 2.0 micrometers. For example, the thickness of the insulation separation layer 3 is 0.5 micrometers. For example, the insulation separation layer 3 is formed by a hot wall CVD method.

Figure 7:
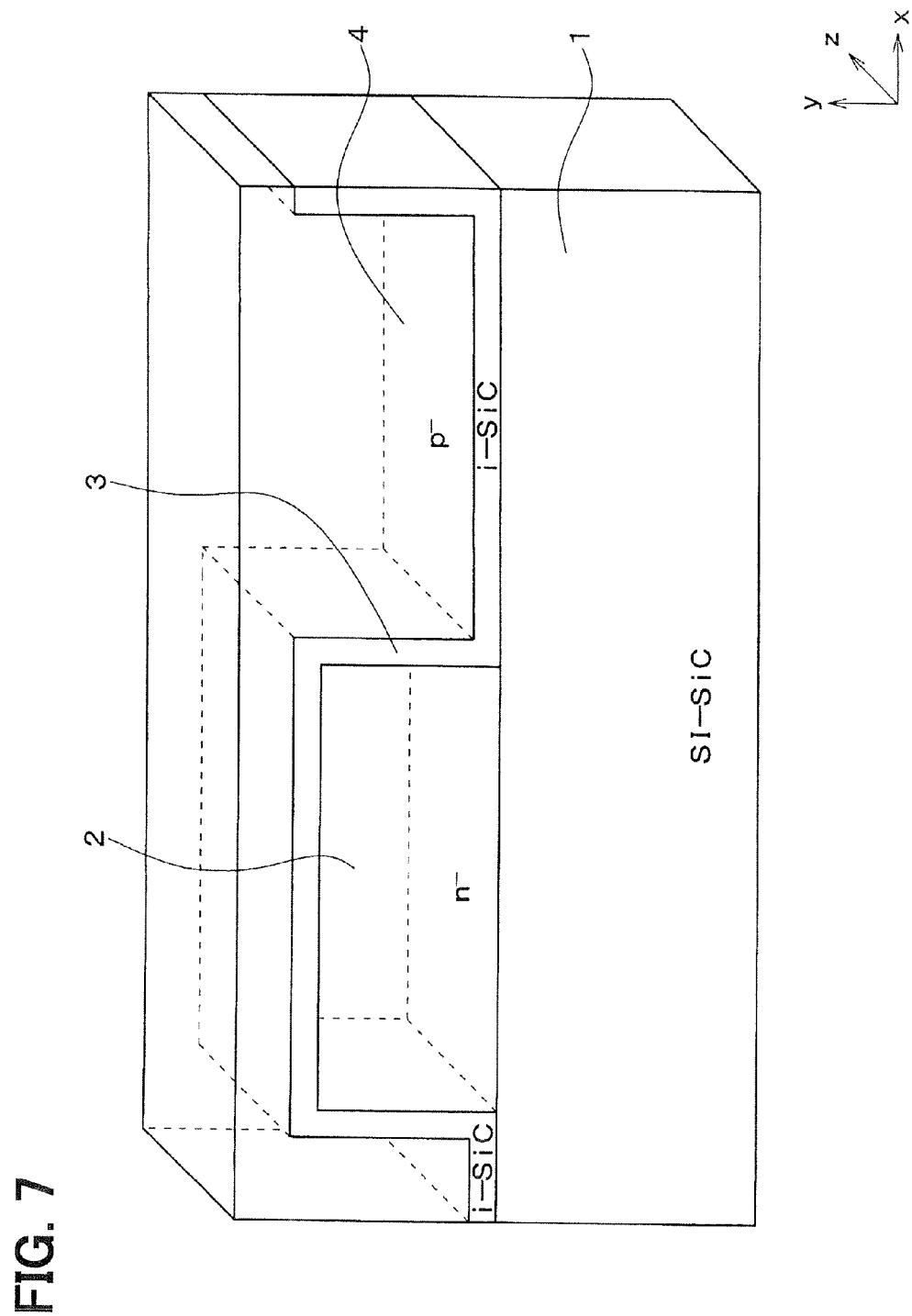

<Step in FIG. 7>

A P conductive type SiC layer 4 is formed on the surface of the insulation separation layer 3 by a hot wall CVD method. The P conductive type impurity concentration of the SiC layer 4 is in a range between $1\times10^{15}$ cm' and $1\times10^{17}$ cm$^{-3}$. For example, the impurity concentration of the SiC layer 4 is $2\times10^{15}$ cm$^{-3}$. The thickness of the SiC layer 4 is in a range between 1.0 and 4.0 micrometers. For example, the thickness of the SiC layer 4 is 1.0 micrometer.

Figure 8:
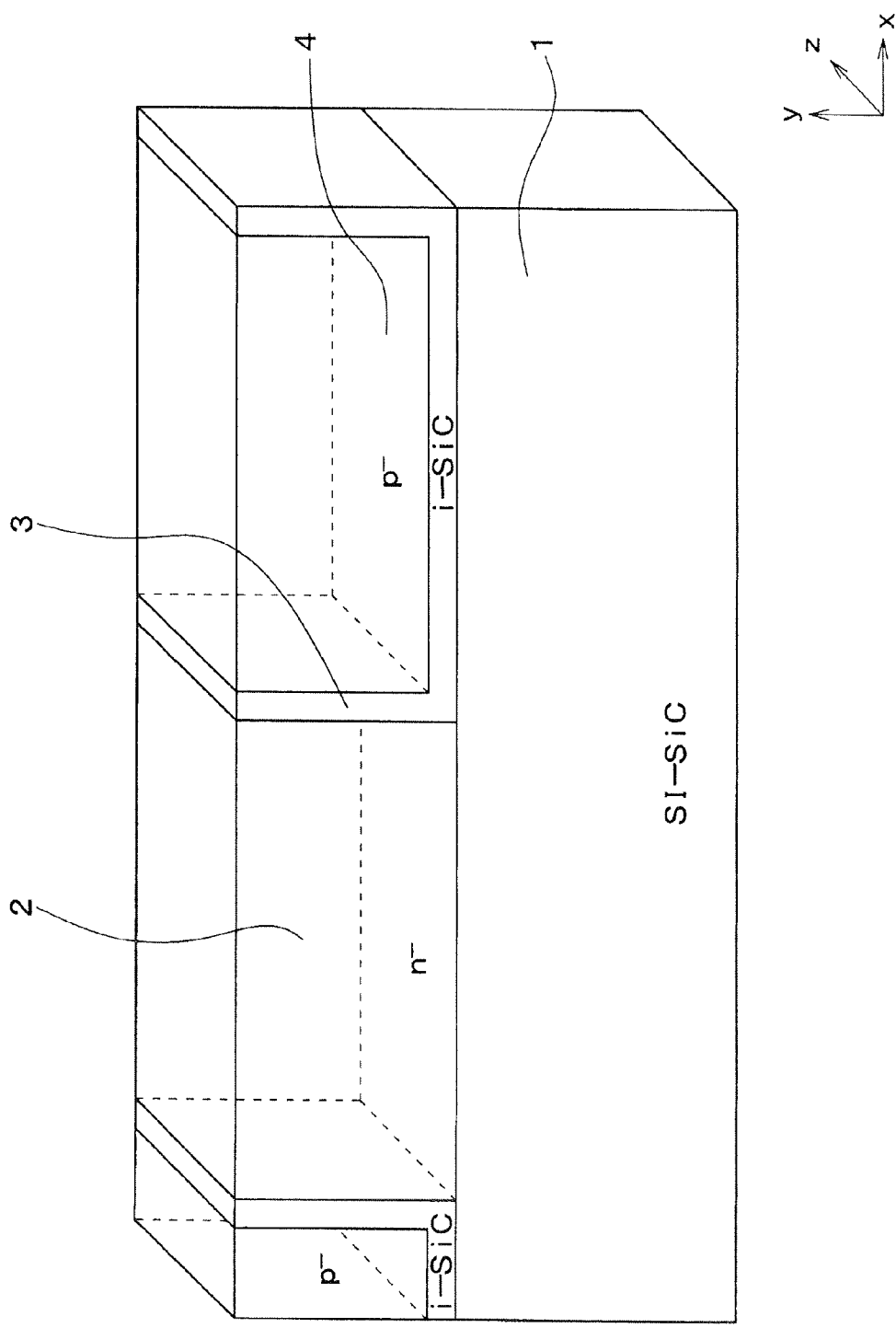

<Step in FIG. 8>

A surface of the SiC layer 4 is ground to reach the insulation separation layer 3, so that the SIC layer 4 and the insulation separation layer 3 are ground. Thus, the N conductive type SiC layer 2 is exposed. Thus, the N conductive type SiC layer 2 and the P conductive type SiC layer 4 are isolated with the insulation separation layer 3.

Figure 9:
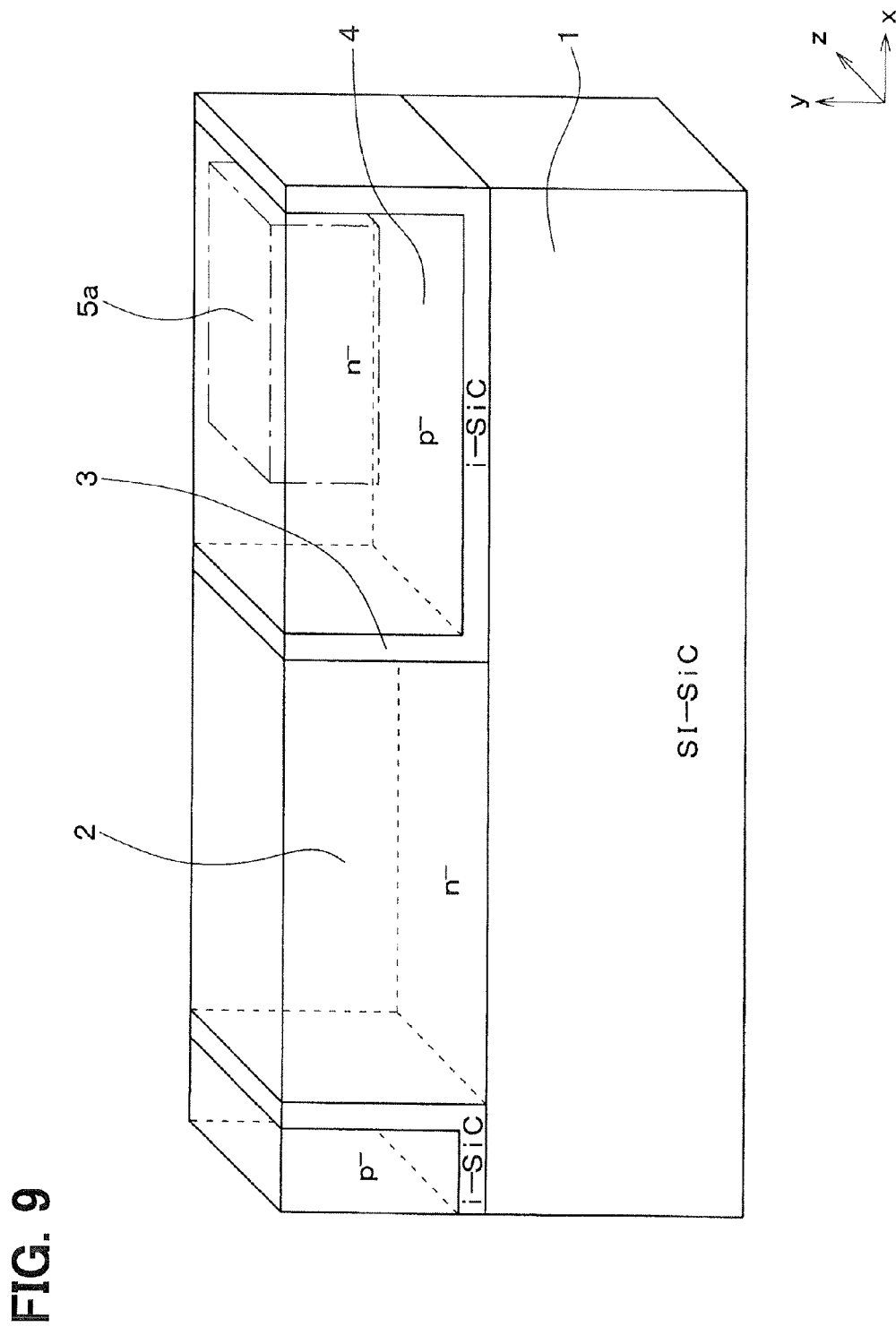

<Step in FIG. 9>

After a mask (not shown) is formed on the surface of the substrate 1. A part of the mask for forming the N conductive type channel layer 5a is opened. An ion of the N conductive type impurity such as nitrogen is implanted on the SiC layer 4 through the mask. Thus, the N conductive type channel layer 5a is formed in the SiC layer 4. Then, the mask is removed.

Figure 10:
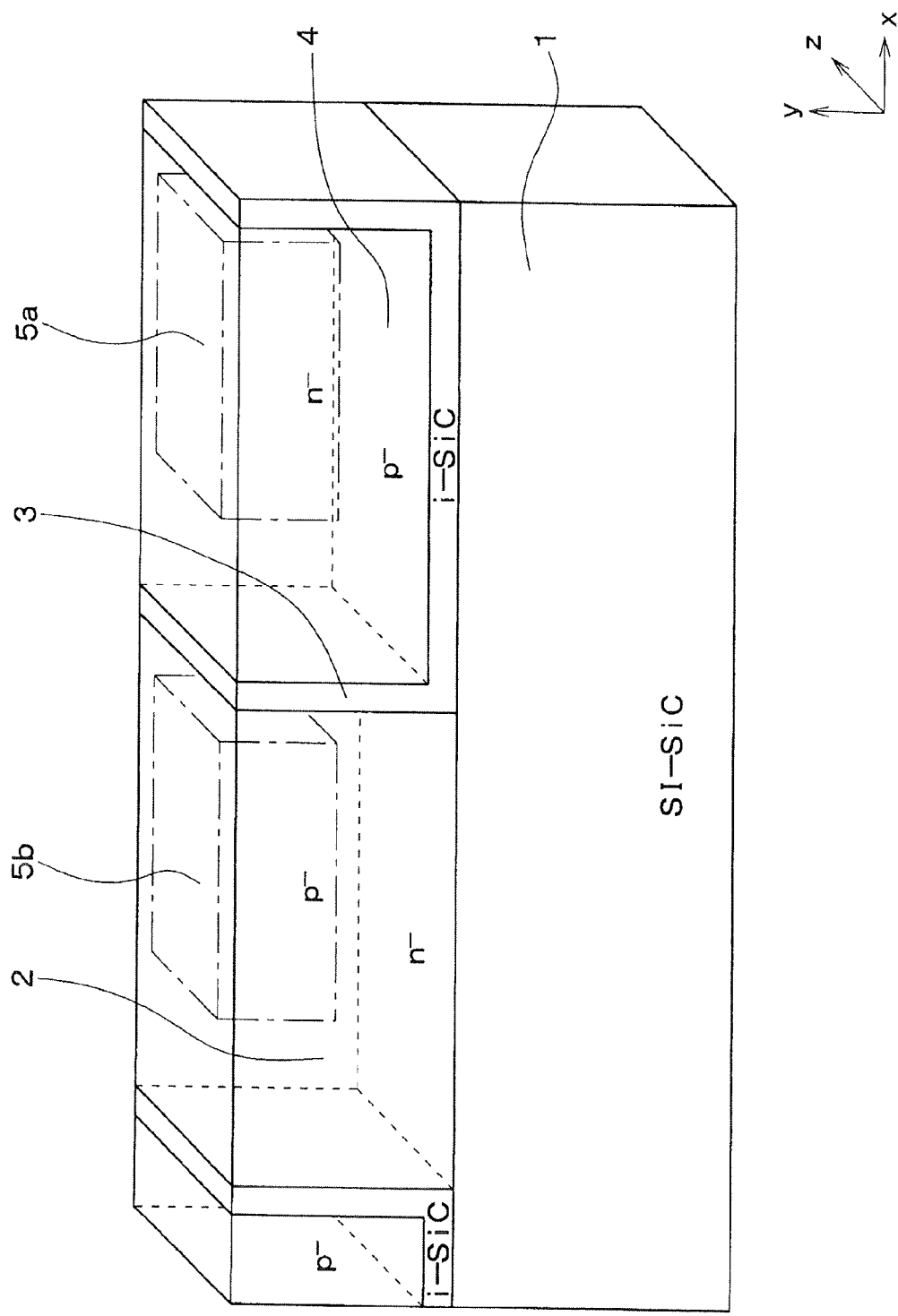

<Step in FIG. 10>

After a mask (not shown) is formed on the surface of the substrate 1, a part of the mask for forming the P conductive type channel layer 5b is opened. An ion of the P conductive type impurity such as aluminum is implanted on the SiC layer 2 through the mask. Thus, the P conductive type channel layer 5b is formed in the SiC layer 2. Then, the mask is removed.

Figure 11:
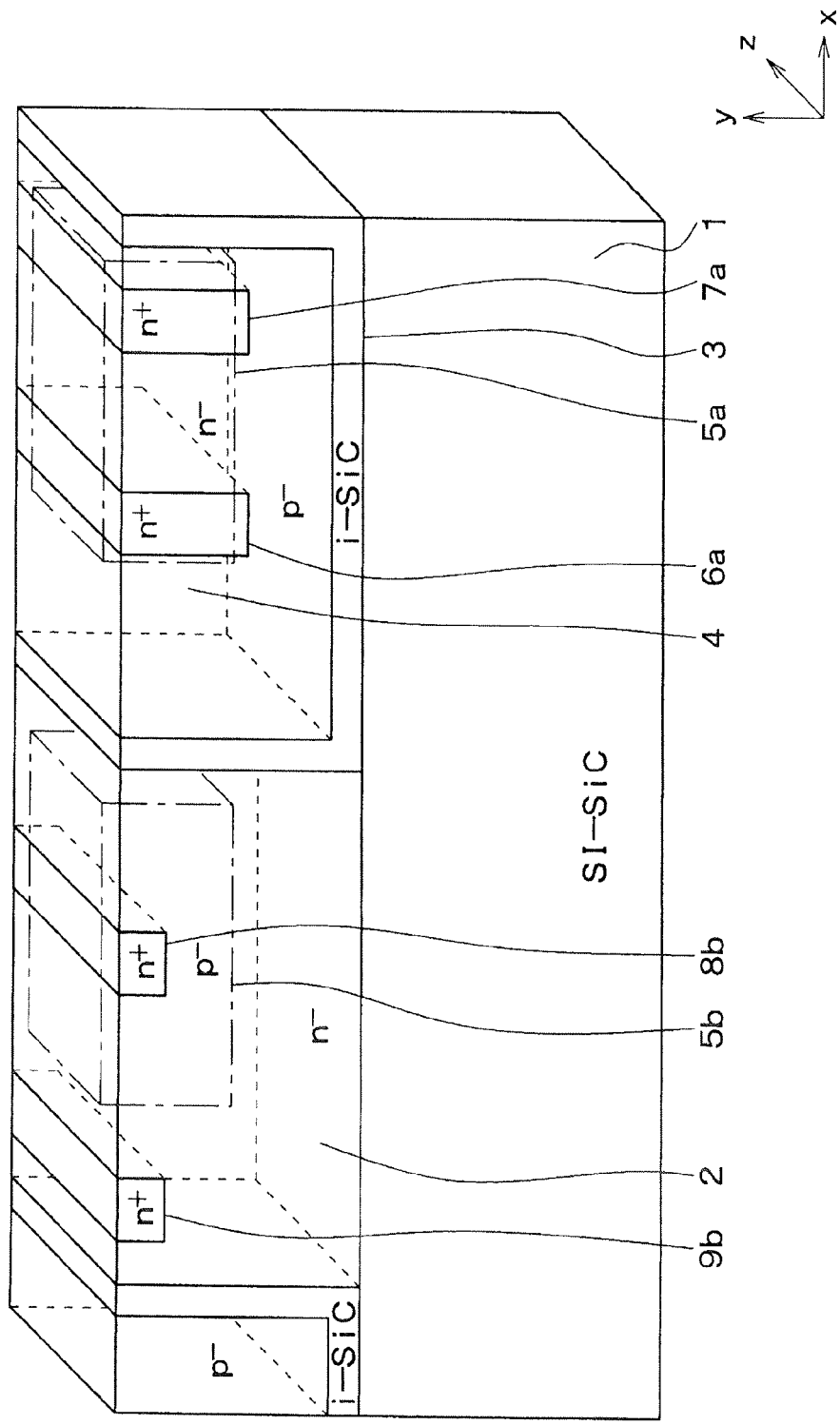

<Step in FIG. 11>

After a mask (not shown) is formed on the surface of the substrate 1, a part of the mask for forming the N conductive type gate region 8b and the N conductive type contact region 9b is opened. Then, an ion of the N conductive type impurity such as nitrogen is implanted on the SiC layer 2 through the mask. Thus, the gate region 8b and the contact region 9b are formed. Then, the mask is removed. After that, another mask is formed on the substrate. A part of the mask for forming the N conductive type source region 6a and the N conductive type drain region 7a is opened. Then, an ion of the N conductive type impurity such as nitrogen is implanted on the SiC layer 4 through the mask. Thus, the source region 6a and the drain region 7a are formed. Then, the mask is removed.

Figure 12:
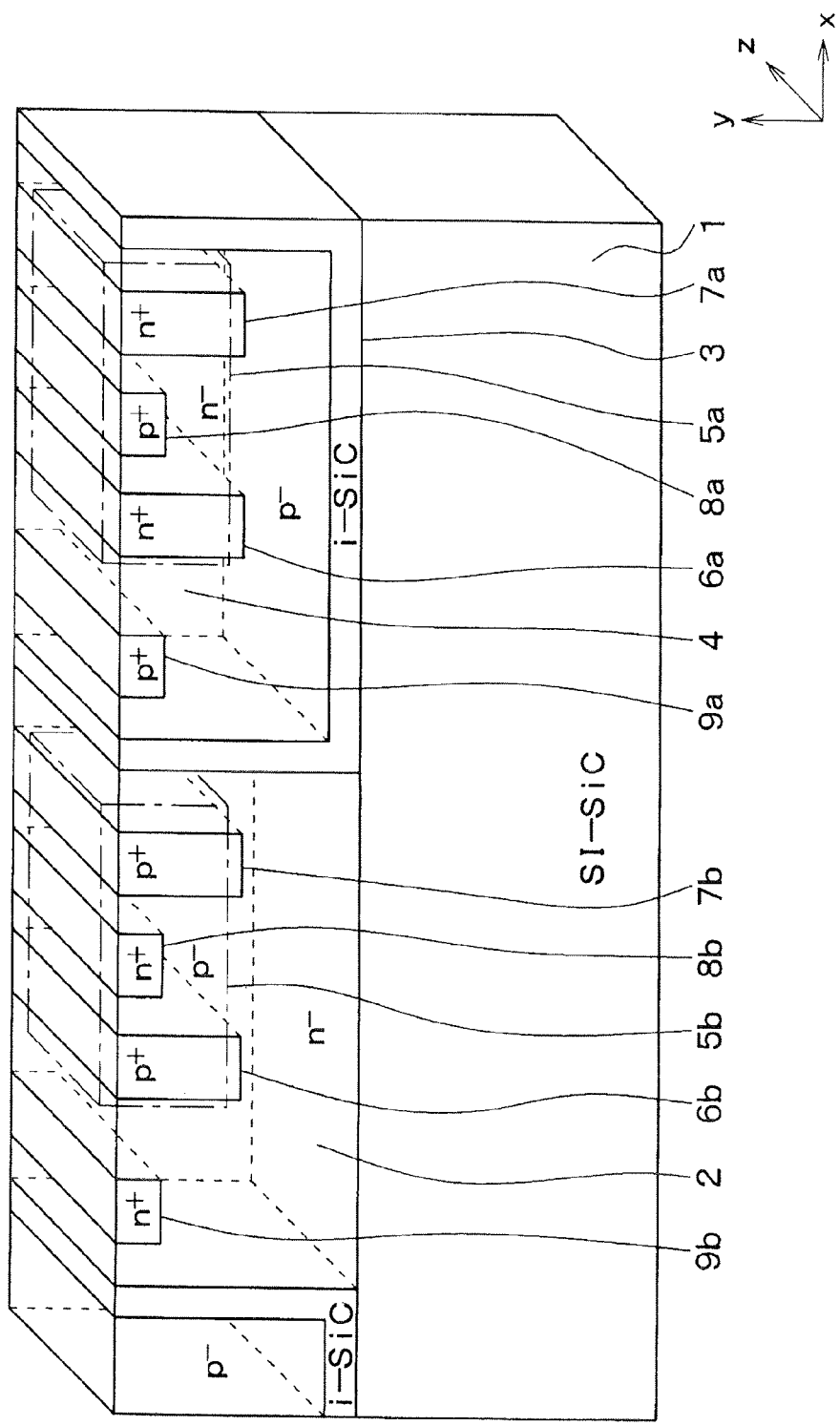

<Step in FIG. 12>

After a mask (not shown) is formed on the surface of the substrate 1, a part of the mask for forming the P conductive type gate region 8a and the P conductive type contact region 9a is opened. Then, an ion of the P conductive type impurity such as aluminum is implanted on the SiC layer 4 through the mask. Thus, the gate region 8a and the contact region 9a are formed. Then, the mask is removed. After that, another mask is formed on the substrate. A part of the mask for forming the P conductive type source region 6b and the P conductive type drain region 7b is opened. Then, an ion of the P conductive type impurity such as aluminum is implanted on the SiC layer 2 through the mask. Thus, the source region 6b and the drain region 7b are formed. Then, the mask is removed.

Although other steps of the manufacturing method are not shown, an interlayer insulation film made of a ONO film is formed on the surface of the substrate 1. Then, the interlayer insulation film is patterned so that a contact hole is formed. After that, a Ni series metal layer, a Ti series metal layer and an aluminum or gold metal layer are stacked in this order on the substrate 1. Then, they are patterned, so that the first gate electrode G1 coupled with the gate region 8a via a contact hole, the first source electrode S1 coupled with the source region 6a, the first drain electrode D1 coupled with the drain region 7a, and the first back gate electrode GB1 coupled with the contact region 9a are formed. Further, the second gate electrode G2 coupled with the gate region 8b, the second source electrode S2 coupled with the source region 6b, the second drain electrode D2 coupled with the drain region 7b, and the second back gate electrode GB2 coupled with the contact region 9b are formed.

Thus, the SiC semiconductor device having the CJFET shown in FIG. 1 is completed.

In the SiC semiconductor device, an element is formed on a flat surface of the substrate 1. Accordingly, an ion implantation step for forming an impurity layer is easily performed. Further, a shift of a focus point of the contact hole does not occur after the interlayer insulation film is formed. The patterning of the electrodes is easily performed. Accordingly, the manufacturing method is simplified.

Since the insulation separation structure is formed by the insulation separation layer 3 made of a i-type layer having a semi-insulating property, not by a PN separation structure, the insulation separation layer 3 absorbs a high frequency noise, so that noise propagation in a high frequency region is reduced. Further, current leakage at high temperature is restricted.

Accordingly, the SiC semiconductor device with the CJFET having the insulation separation structure, in which an electric element is formed on a flat surface of the substrate, provides to reduce the noise propagation at the high frequency and the current leakage at the high temperature.

In the present embodiment, the P conductive type SiC layer 4 is covered with the insulation separation layer 3. Thus, the N conductive type SiC layer 2 and the P conductive type SiC layer 4 are electrically separated from each other.

(Second Embodiment)

A second embodiment will be explained. A SiC semiconductor device according to the present embodiment has the first back gate electrode GB1, the first source electrode S1, the second back gate electrode GB2 and the second source electrode S2, which are different from the first embodiment.

Figure 13:
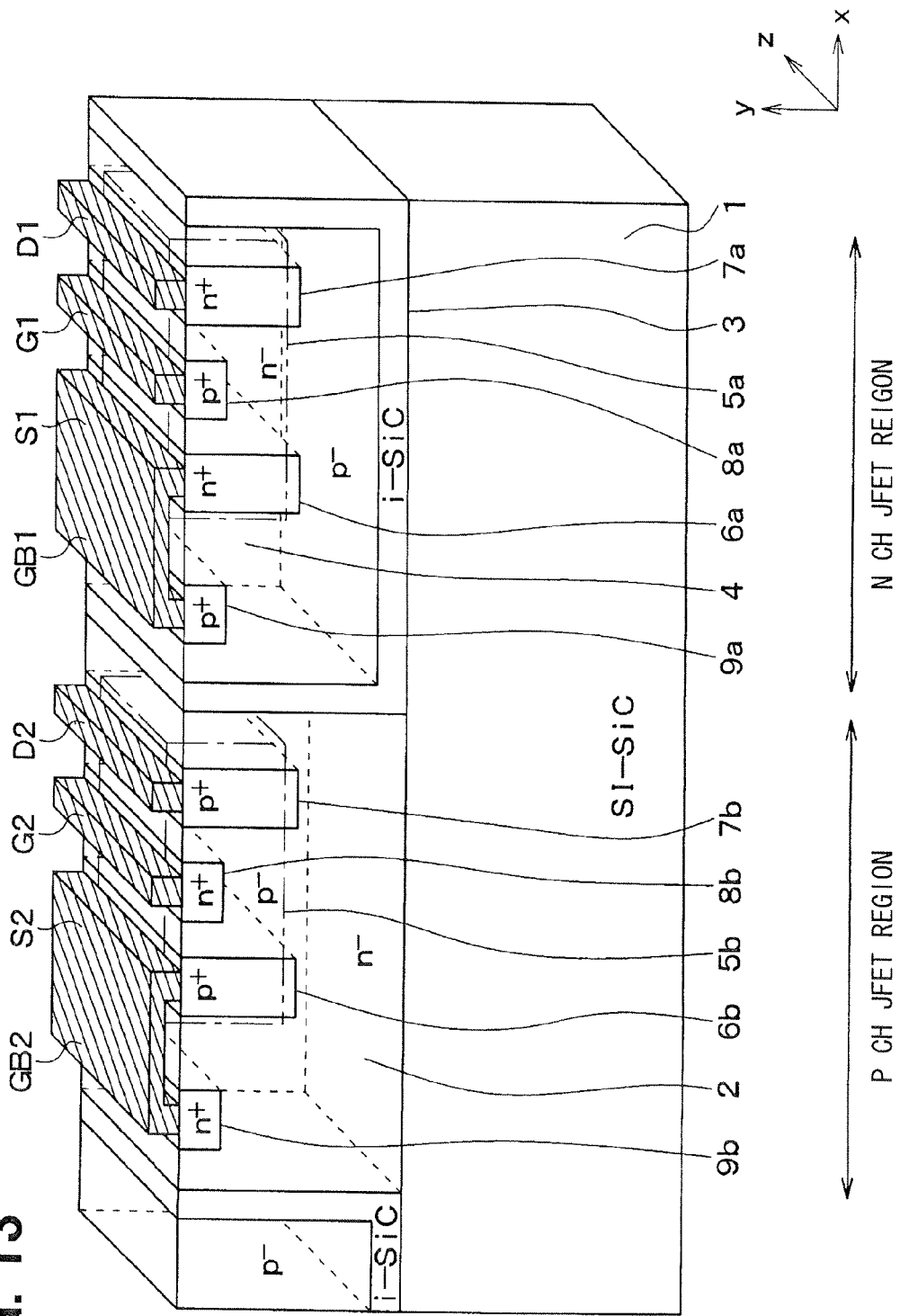
FIG. 13 is a diagram showing a SIC semiconductor device having a CJFET according to a second embodiment.

FIG. 13 shows the SiC semiconductor device having the CJFET. As shown in FIG. 13, the first back gate electrode GB1 and the first source electrode S1 are common so that the potential of the first back gate electrode GB1 is fixed to the potential of the first source electrode S1. Further, the second back gate electrode GB2 and the second source electrode S2 are common so that the potential of the second back gate electrode GB2 is fixed to the potential of the second source electrode S2.

Thus, when the first back gate electrode GB1 and the first source electrode 51 are common, and the second back gate electrode GB2 and the second source electrode S2 are common, the potential of the first back gate electrode GB1 is fixed to the potential of the first source electrode 51, and the potential of the second back gate electrode GB2 is fixed to the potential of the second source electrode S2. The manufacturing method of the device according to the present embodiment is similar to the manufacturing method of the first embodiment with a different pattern of electrodes.

(Third Embodiment)

A third embodiment will be explained. A SiC semiconductor device according to the present embodiment has the insulation separation layer 3, which is different from the first embodiment.

Figure 14:
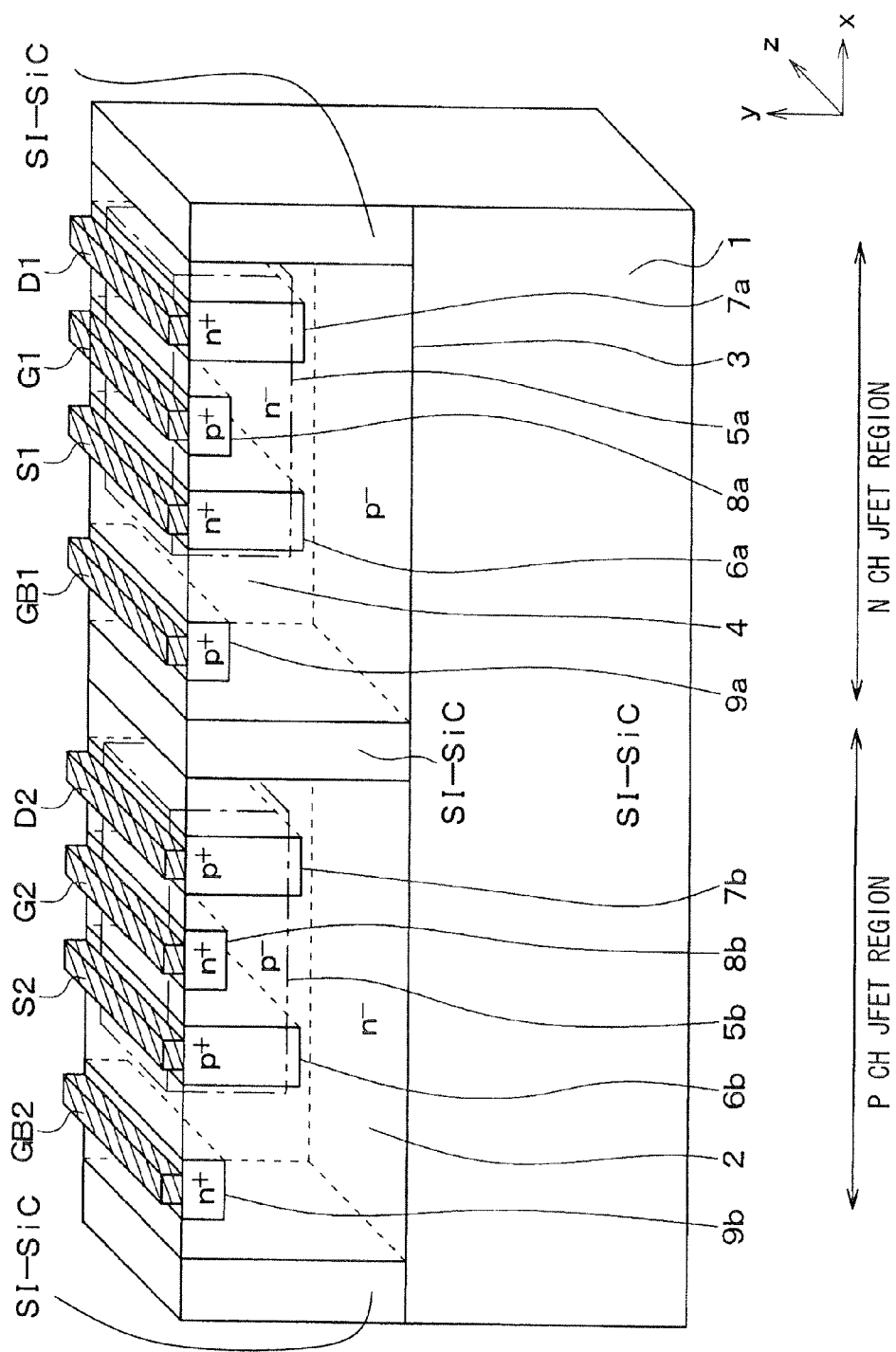
FIG. 14 is a diagram showing a SiC semiconductor device having a CJFET according to a third embodiment.

FIG. 14 shows the SiC semiconductor device having the CJFET. As shown in FIG. 14, in the present embodiment, not only the N conductive type SiC layer 2 is formed in the P channel JFET region on the surface of the substrate 1, but also the P conductive type SiC layer 4 is directly formed in the N channel JFET region. The P channel JFET region and the N channel JFET region are separated and insulated from each other with the insulation separation layer 3, which extends along with the vertical direction of the substrate 1. Specifically, in the present embodiment, the insulation separation layer 3 is not arranged to surround the sidewall and the bottom of the P conductive type SiC layer 4, but arranged to be disposed on the sidewall of the P conductive type SiC layer 4. More specifically, the insulation separation layer 3 partitions between the P channel JFET region and the N channel JFET region. The insulation separation layer 3 may be formed by the CVD method or the like. Alternatively, the insulation separation layer 3 may be formed from a part of the SiC substrate 1.

Thus, the insulation separation layer 3 partitions only between the P channel JFET region and the N channel JFET region.

In the SiC semiconductor device, for example, when the insulation separation layer 3 is formed from a part of the substrate 1, the insulation separation layer 3 is arranged between the N conductive type SiC layer 2 and the P conductive type SiC layer 4.

For example, after a trench is formed in a position of the substrate 1, at which the N conductive type SiC layer 2 is to be formed, the N conductive type SiC layer 2 is epitaxially grown on the substrate 1 to fill the trench. After that, the surface of the substrate 1 is flattened so as to remain the N conductive type SiC layer 2 only in the trench. A P conductive type impurity is implanted at a position of the substrate 1, at which the P conductive type SiC layer 4 is to be formed so that the P conductive type SIC layer 4 is formed in the substrate 1. Thus, the insulation separation layer 3 is arranged between the N conductive type SiC layer 2 and the P conductive type SiC layer 4. Thus, the structure that the insulation separation layer 3 partitions between the N conductive type SiC layer 2 and the P conductive type SIC layer 4 is completed.

The N conductive type SiC layer 2 is formed in the trench, and then, the P conductive type SiC layer 4 is formed by the ion implantation method. Alternatively, the P conductive type SiC layer 4 may be formed in the trench, and then, the N conductive type SiC layer 2 may be formed by the ion implantation method. Alternatively, the N conductive type SiC layer 2 and the P conductive type SiC layer 4 may be formed in different trenches. Alternatively, the N conductive type SiC layer 2 and the P conductive type SiC layer 4 may be formed by the ion implantation method. Here, the order of the step for performing the ion implantation method and the step for forming the trench and filling the trench with SiC layer 2, 4 may be any, so that the step for performing the ion implantation method is performed prior to the step for forming the trench and filling the trench with SiC layer 2, 4, or the step for forming the trench and filling the trench with SiC layer 2, 4 is performed prior to the step for performing the ion implantation method.

Alternatively, similar to the manufacturing method according to the first embodiment, the insulation separation layer 3 may be arranged between the N conductive type SiC layer 2 and the P conductive type SiC layer 4. For example, after the step for forming the insulation separation layer 3 shown in FIG. 6, the insulation separation layer 3 is etched back so that the insulation separation layer 3 remains only on the sidewall of the N conductive type SiC layer 2. After that, the step for forming the P conductive type SiC layer 4 and the step for flattening the surface of the substrate 1 are performed. Thus, the insulation separation layer 3 is arranged between the N conductive type SiC layer 2 and the P conductive type SiC layer 4.

Alternatively, after the N conductive type SiC layer 2 is formed and the N conductive type SiC layer 2 is patterned, the P conductive type SiC layer 4 is deposited, and the surface of the substrate 1 is flattened. Then, the trench is formed at a position of the substrate 1, at which the insulation separation layer 3 is to be formed. Then, the insulation separation layer 3 is filled in the trench, and further, the surface is flattened.

(Fourth Embodiment)

A fourth embodiment will be explained. A SiC semiconductor device according to the present embodiment has the first back gate electrode GB1, the first source electrode S1, the second back gate electrode GB2 and the second source electrode S2, which are different from the third embodiment.

Figure 15:
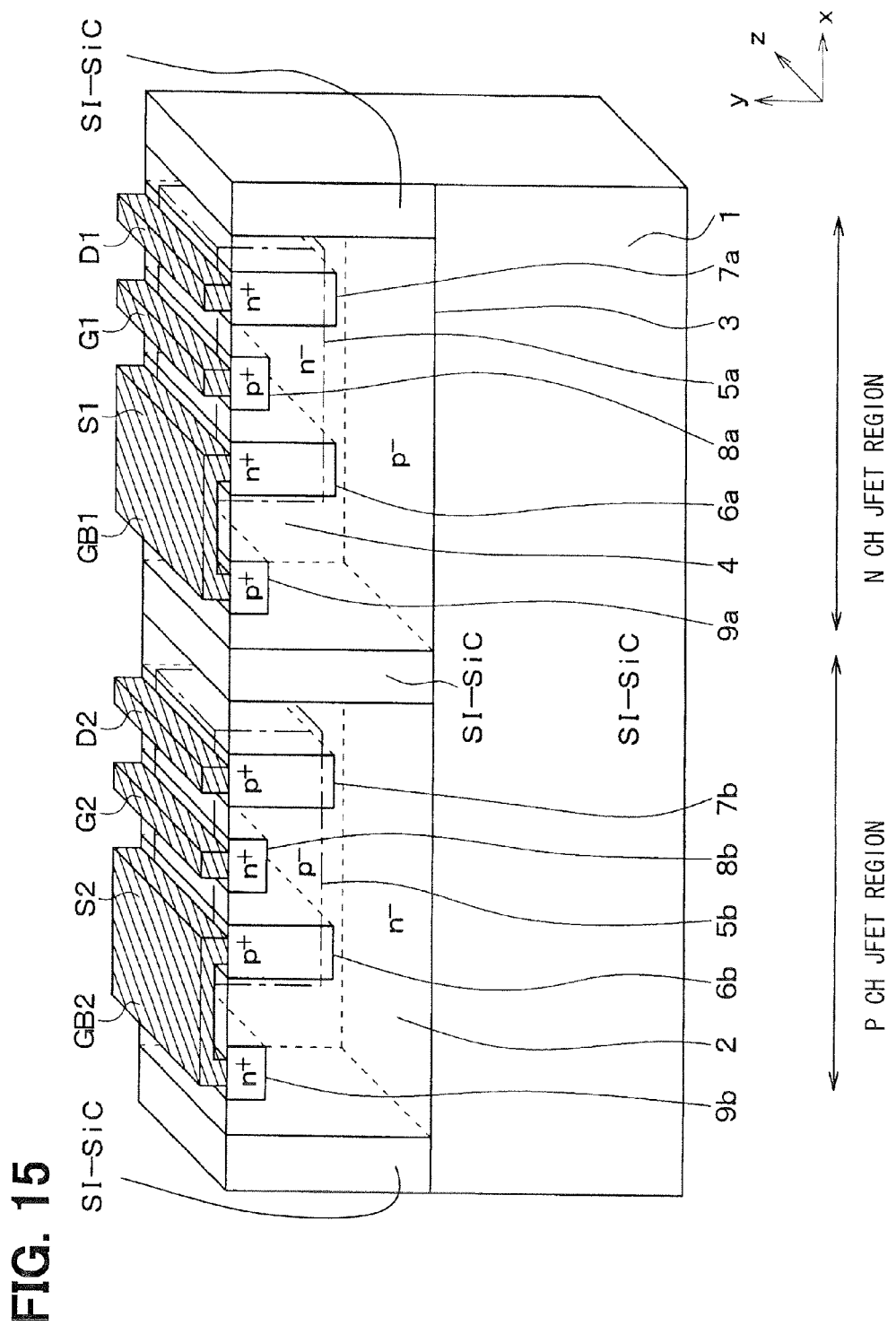
FIG. 15 is a diagram showing a SIC semiconductor device having a CJFET according to a fourth embodiment.

FIG. 15 shows the SiC semiconductor device having the CJFET according to the present embodiment. As shown in FIG. 15, the first back gate electrode GB1 and the first source electrode S1 are common so that the electric potential of the first back gate electrode GB1 is fixed to the electric potential of the first source electrode S1. Further, the second back gate electrode GB2 and the second source electrode S2 are common so that the electric potential of the second back gate electrode GB2 is fixed to the electric potential of the second source electrode S2.

Thus, since the first back gate electrode GB1 and the first source electrode S1 are common, and the second back gate electrode GB2 and the second source electrode S2 are common, the electric potential of the first back gate electrode GB1 is fixed to the electric potential of the first source electrode S1, and the electric potential of the second back gate electrode GB2 is fixed to the electric potential of the second source electrode S2.

The manufacturing method of the device according to the present embodiment is similar to the manufacturing method of the third embodiment with a different pattern of electrodes.

(Fifth Embodiment)

A fifth embodiment will be explained. In a SiC semiconductor device according to the present embodiment, the P channel JFET is formed in the P conductive type SiC layer 4, the N channel JFET is formed in the N conductive type SiC layer 2, and the P and N channel JFETs area different from the first embodiment.

Figure 16:
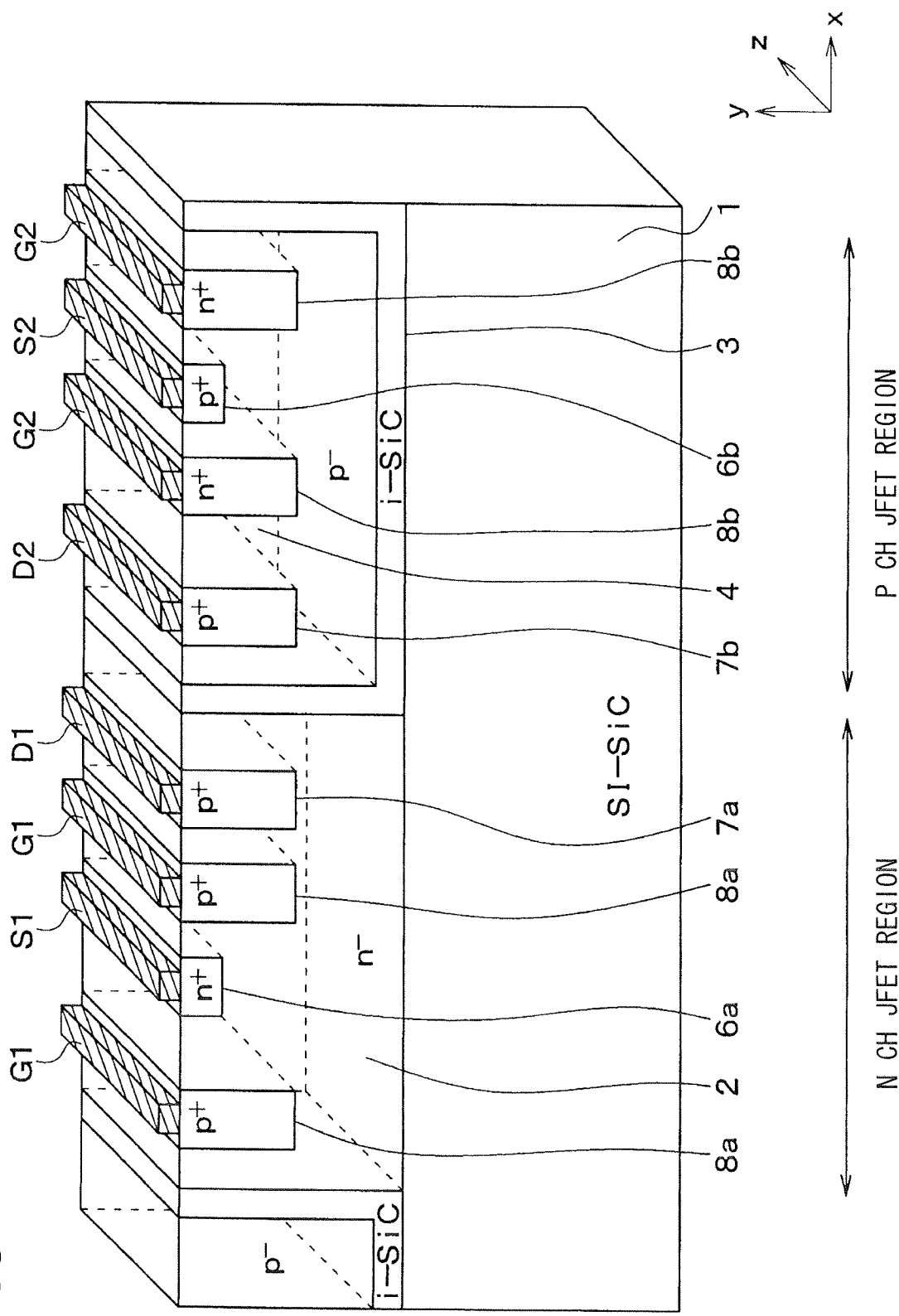
FIG. 16 is a diagram showing a SiC semiconductor device having a CJFET according to a fifth embodiment.

FIG. 16 shows the SiC semiconductor device having the CJFET according to the present embodiment. As shown in FIG. 16, two P conductive type gate regions 8a are separated from each other, and disposed in a surface portion of the SiC layer 2. The N conductive type source region 6a is disposed between two P conductive type gate regions 8a. The depth of the source region 6a is shallower than the gate regions 8a. A N conductive type drain region 7a is disposed on an opposite side of the source region 6a via the gate region 8a. The gate region 8a, the source region 6a and the drain region 7a are arranged to have a stripe pattern. The gate region 8a, the source region 6a and the drain region 7a are electrically coupled with the first gate electrode C1, the first source electrode S1 and the first drain electrode D1, respectively.

Two N conductive type gate regions 8b are separated from each other, and disposed in a surface portion of the P conductive type SiC layer 4. The P conductive type source region 6b is disposed between two N conductive type gate regions 8b. The depth of the source region 6b is shallower than the gate regions 8b. A P conductive type drain region 7b is disposed on an opposite side of the source region 6b via the gate region 8b. The gate region 8b, the source region 6b and the drain region 7b are arranged to have a stripe pattern. The gate region 8b, the source region 6b and the drain region 7b are electrically coupled with the second gate electrode C2, the second source electrode S2 and the second drain electrode D2, respectively.

In the SiC semiconductor device, the N conductive type SiC layer 2 provides a N conductive type channel layer so that the N channel JFET functions. The P conductive type SiC layer 4 provides a P conductive type channel layer so that the P channel JFET functions. Thus, when a gate voltage to be applied to two first gate electrodes G1 and two second gate electrodes G2 is controlled, the depletion layer extending in the N conductive type SiC layer 2 between two gate regions 8a and the depletion layer extending in the P conductive type SiC layer 4 between the N conductive type gate regions 8b are controlled in an extending amount. When the depletion layer sufficiently extends so that the channel is completely pinched off, the current does not flow between the source and the drain. When the depletion layer shrinks so that the channel is formed, the current flows between the source and the drain. Thus, for example, the SiC semiconductor device provides a circuit diagram shown in FIG. 3 so that the output voltage Vout is controlled to have one of the high lever and the low level. Thus, the CJFET functions properly.

Thus, in the CJFET, the N conductive type SiC layer 2 between two gate regions 8a provides the N channel, and the P conductive type SiC layer 4 between two gate regions 8b provides the P channel. In this case, the effects similar to the first embodiment are obtained.

(Sixth Embodiment)

A sixth embodiment will be explained. In a SiC semiconductor device according to the present embodiment, the P conductive type gate region 8a and the N conductive type gate region 8b are divided into two parts, respectively.

Figure 17:
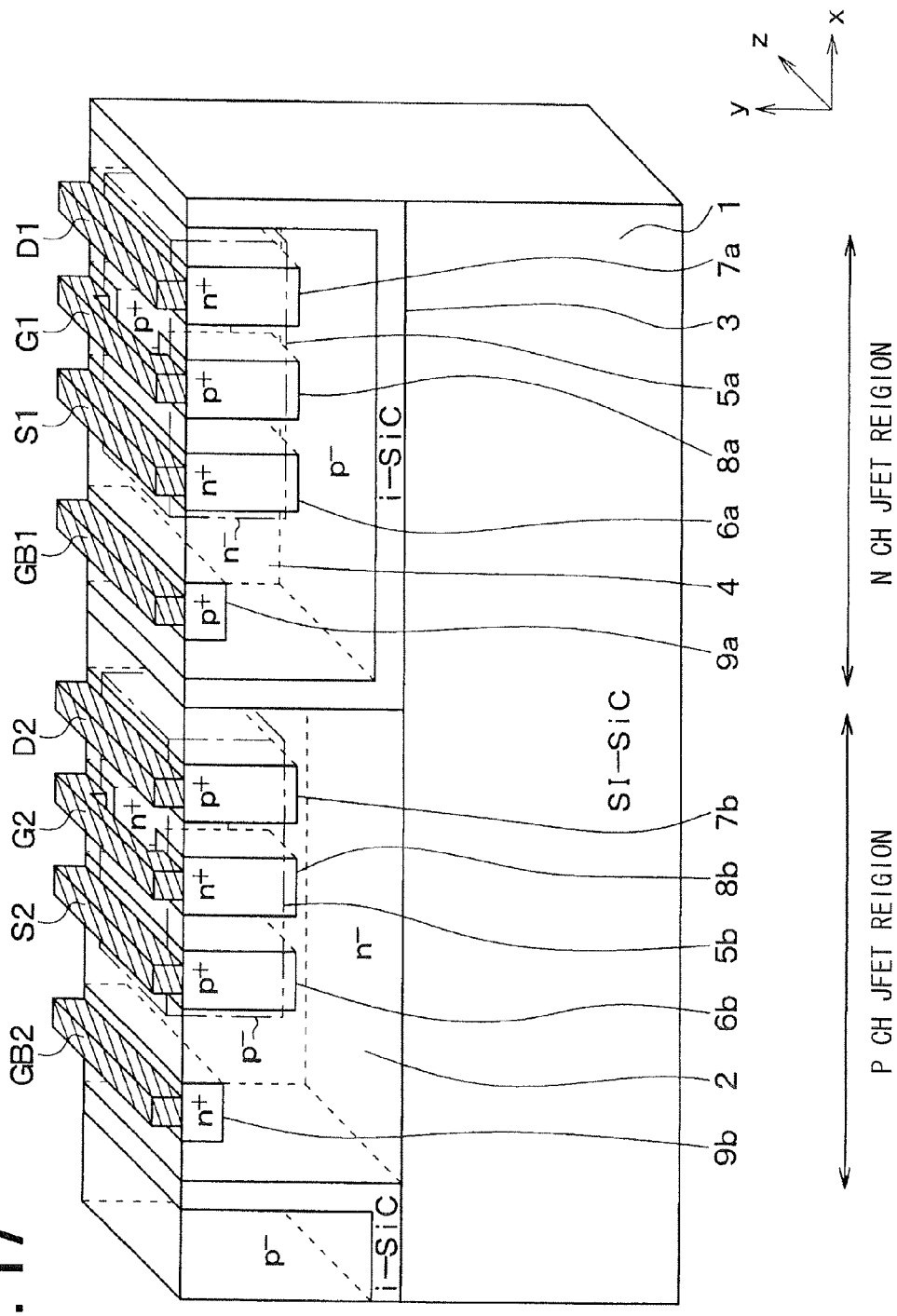
FIG. 17 is a diagram showing a SiC semiconductor device having a CJFET according to a sixth embodiment.

FIG. 17 shows the SiC semiconductor device having the CJFET according to the present embodiment. As shown in FIG. 17, in the N channel JFET, the P conductive type gate region 8a is divided into two parts in a direction (i.e., the Z direction) perpendicular to the arrangement direction of the source region 6a and the drain region 7a. In the P channel JFET, the N conductive type gate region 8b is divided into two parts in a direction (i.e., the Z direction) perpendicular to the arrangement direction of the source region 6b and the drain region 7b. Thus, the P conductive type gate region 8a and the N conductive type gate region 8b are divided into two parts, respectively, in the direction perpendicular to the current flowing direction. Divided P conductive type gate region 8a is electrically coupled with the first gate electrode G1, and the divided N conductive type gate region 8b is electrically coupled with the second gate electrode G2.

The SiC semiconductor device having the CJFET functions similar to the device according to the first embodiment. However, in the N channel JFET, a part of the channel layer 5a sandwiched between two parts of the divided P conductive type gate region 8a provides a channel region. The depletion layer extending from the divided P conductive type gate region 8a and the P conductive type SiC layer 4 controls the channel region. In the P channel JFET, a part of the channel layer 5b sandwiched between two parts of the divided N conductive type gate region 8b provides a channel region. The depletion layer extending from the divided N conductive type gate region 8b and the N conductive type SiC layer 2 controls the channel region.

Thus, the P conductive type gate region 8a and the N conductive type gate region 8b are divided into two parts, respectively, in the direction perpendicular to the current flowing direction. The depletion layer extending from the two parts of the P conductive type gate region 8a and two parts of the N conductive type gate region 8b and the depletion layer extending from the P conductive type SiC layer 4 and the N conductive type SiC layer 2 control the channel region. The manufacturing method of the SiC semiconductor device may be similar to the first embodiment other than the pattern of the mask for forming the P conductive type gate region 8a and the P conductive type gate region 8b and the ion implantation energy.

(Seventh Embodiment)

A seventh embodiment will be explained. A SiC semiconductor device according to the present embodiment has the first back gate electrode GB1, the first source electrode S1, the second back gate electrode GB2 and the second source electrode S2, which are different from the sixth embodiment.

Figure 18:
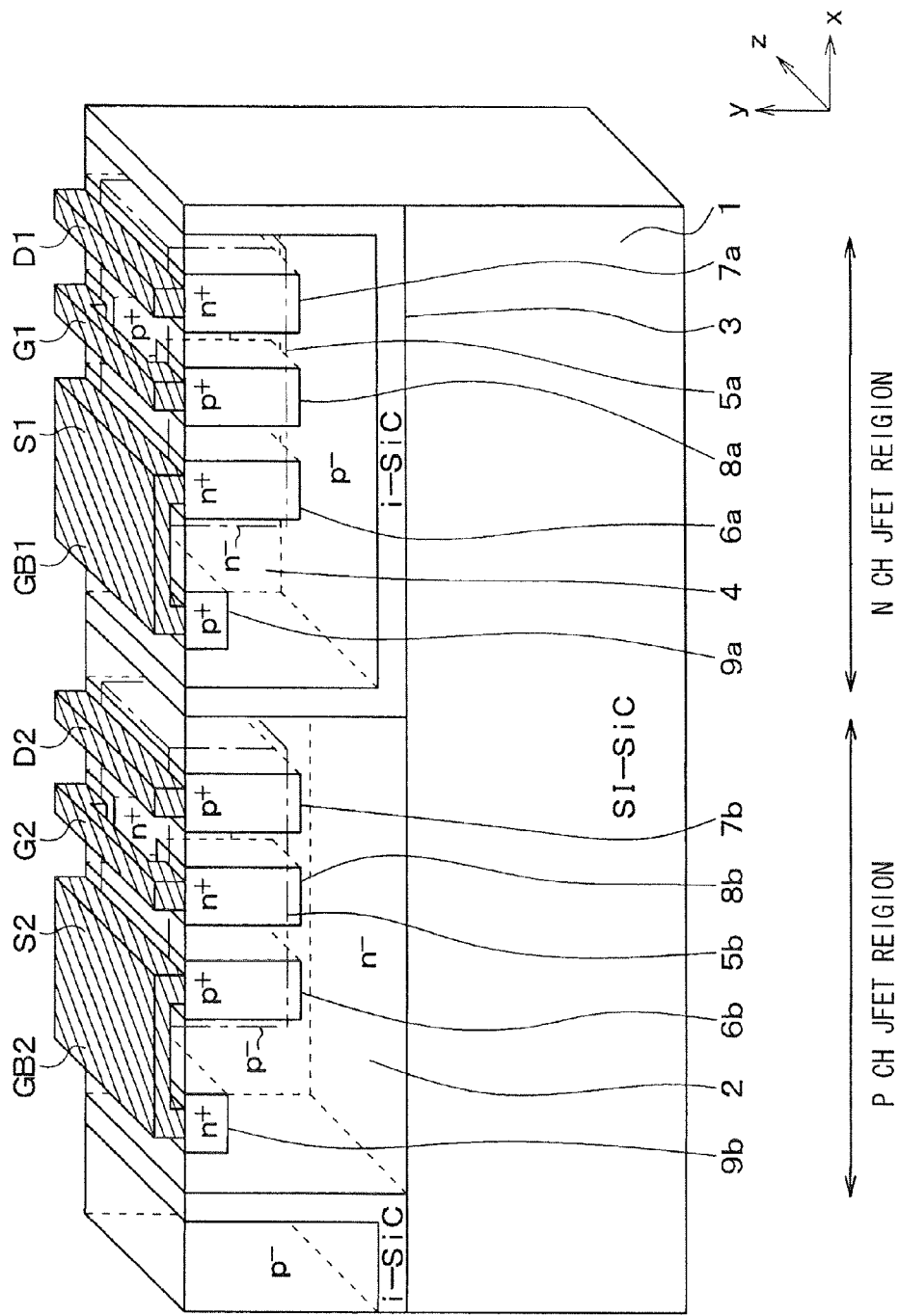
FIG. 18 is a diagram showing a SiC semiconductor device having a CJFET according to a seventh embodiment.

FIG. 18 shows the SiC semiconductor device having the CJFET according to the present embodiment. As shown in FIG. 18, the first back gate electrode GB1 and the first source electrode S1 are common so that the electric potential of the first back gate electrode GB1 is fixed to the electric potential of the first source electrode S1. Further, the second back gate electrode GB2 and the second source electrode S2 are common so that the electric potential of the second back gate electrode GB2 is fixed to the electric potential of the second source electrode S2.

Thus, since the first back gate electrode GB1 and the first source electrode S1 are common, and the second back gate electrode GB2 and the second source electrode S2 are common, the electric potential of the first back gate electrode GB1 is fixed to the electric potential of the first source electrode S1, and the electric potential of the second back gate electrode GB2 is fixed to the electric potential of the second source electrode. S2. The manufacturing method of the device according to the present embodiment is similar to the manufacturing method of the sixth embodiment with a different pattern of electrodes.

(Other Embodiments)

In the above embodiments, the N conductive type SiC layer 2 is formed on the surface of the substrate 1, and then, the P conductive type SiC layer 4 is formed. Alternatively, after the P conductive type SiC layer 4 may be formed on the surface of the substrate 1, the N conductive type SiC layer 2 may be formed.

In this case, the insulation separation layer 3 surrounds the N conductive type SIC layer 2, instead of the P conductive type SiC layer 4.

The SiC semiconductor device having the CJFET provides the circuit shown in FIG. 3. Alternatively, the SiC semiconductor device having the CJFET according to second to seventh embodiments may provide the circuit shown in FIG. 3.

The above disclosure has the following aspects.

According to a first aspect of the present disclosure, a SiC semiconductor device includes: a SiC substrate made of intrinsic SiC having semi-insulating property and including a first surface; a first conductive type SiC layer disposed in a surface portion of the substrate on the first surface; a second conductive type SiC layer disposed in another surface portion of the substrate on the first surface; an insulation separation layer made of intrinsic SIC for isolating the first conductive type SiC layer from the second conductive type SiC layer, wherein the insulation separation layer extends along with a first direction perpendicular to the first surface of the substrate; a first conductive type channel JFET disposed in one of the first conductive type SiC layer and the second conductive type SiC layer; and a second conductive type channel JFET disposed in the other of the first conductive type SiC layer and the second conductive type SiC layer. The first conductive type channel JFET and the second conductive type channel JFET provide a complementary junction field effect transistor.

In the above device, the insulation separation layer isolates the first conductive type SIC layer from the second conductive type SiC layer, so that an electric element in the complementary junction field effect transistor is formed on a flat surface of the substrate. The manufacturing method of the device is simplified. Further, the insulation separation layer is made of an intrinsic SIC layer having the semi-insulating property instead of a PN junction separation, and therefore, high frequency noise is absorbed in the insulation separation layer so that noise propagation at high frequency is restricted. Further, current leakage at high temperature is restricted.

Alternatively, the first conductive type channel JFET may include: a first conductive type channel layer disposed in a surface portion of the second conductive type SIC layer; a second conductive type contact region disposed in another surface portion of the second conductive type SiC layer and having an impurity concentration higher than the second conductive type SiC layer; a first conductive type source region and a first conductive type drain region, which are spaced apart from each other, and disposed in first and second surface portions of the first conductive type channel layer in such a manner that the first conductive type source region and the first conductive type drain region sandwich at least a part of the first conductive type channel layer, each of the first conductive type source region and the first conductive type drain region having an impurity concentration higher than the first conductive type channel layer; a second conductive type gate region disposed in a third surface portion of the first conductive type channel layer between the first conductive type source region and the first conductive type drain region; a first gate electrode electrically coupled with the second conductive type gate region; a first source electrode electrically coupled with the first conductive type source region; a first drain electrode electrically coupled with the first conductive type drain region; and a first back gate electrode electrically coupled with the second conductive type contact region. The second conductive type channel JFET may include: a second conductive type channel layer disposed in a surface portion of the first conductive type SiC layer; a first conductive type contact region disposed in another surface portion of the first conductive type SiC layer and having an impurity concentration higher than the first conductive type SIC layer; a second conductive type source region and a second conductive type drain region, which are spaced apart from each other, and disposed in first and second surface portions of the second conductive type channel layer in such a manner that the second conductive type source region and the second conductive type drain region sandwich at least a part of the second conductive type channel layer, each of the second conductive type source region and the second conductive type drain region having an impurity concentration higher than the second conductive type channel layer; a first conductive type gate region disposed in a third surface portion of the second conductive type channel layer between the second conductive type source region and the second conductive type drain region; a second gate electrode electrically coupled with the first conductive type gate region; a second source electrode electrically coupled with the second conductive type source region; a second drain electrode electrically coupled with the second conductive type drain region; and a second back gate electrode electrically coupled with the first conductive type contact region.

Further, the first source electrode and the first back gate electrode may be common, and the second source electrode and the second back gate electrode may be common. In this case, the electric potential of the first back gate electrode is fixed to the first source electrode, and the electric potential of the second back gate electrode is fixed to the second source electrode.

Further, the first conductive type source region and the first conductive type drain region may have a stripe pattern along with a second direction in parallel to the first surface of the substrate. The second conductive type gate region is divided into two parts in the second direction. A part of the second conductive type SiC layer sandwiched between the two parts of the second conductive type gate region provides a channel region. The second conductive type source region and the second conductive type drain region have a stripe pattern along with the second direction. The first conductive type gate region is divided into two parts in the second direction. A part of the first conductive type SiC layer sandwiched between the two parts of the first conductive type gate region provides a channel region. Thus, since the first conductive type gate region and the second conductive type gate region are divided into two parts, respectively, in a direction perpendicular to a current flowing direction, the depletion layer extending from the two parts of the first conductive type gate region and the two parts of the second conductive type gate region and the depletion layer extending from the second conductive type SiC layer and the first conductive type SiC layer controls the channel region.

Alternatively, the first conductive type channel JFET includes: a first conductive type source region disposed in a first surface portion of the first conductive type SiC layer and having an impurity concentration higher than the first conductive type SiC layer; a first conductive type drain region disposed in a second surface portion of the first conductive type SiC layer and having an impurity concentration higher than the first conductive type SiC layer; a pair of second conductive type gate regions spaced apart from each other and disposed in third and fourth surface portions of the first conductive type SiC layer; a first gate electrode electrically coupled with the pair of second conductive type gate regions; a first source electrode electrically coupled with the first conductive type source region; and a first drain electrode electrically coupled with the first conductive type drain region. The first conductive type source region is sandwiched between the pair of second conductive type gate regions. The first conductive type drain region is disposed on an opposite side of the first conductive type source region via one of the second conductive type gate regions. The second conductive type channel JFET includes: a second conductive type source region disposed in a first surface portion of the second conductive type SiC layer and having an impurity concentration higher than the second conductive type SiC layer; a second conductive type drain region disposed in a second surface portion of the second conductive type SiC layer and having an impurity concentration higher than the second conductive type SiC layer; a pair of first conductive type gate regions spaced apart from each other and disposed in third and fourth surface portions of the second conductive type SiC layer; a second gate electrode electrically coupled with the pair of first conductive type gate regions; a second source electrode electrically coupled with the second conductive type source region; and a second drain electrode electrically coupled with the second conductive type drain region. The second conductive type source region is sandwiched between the pair of first conductive type gate regions. The second conductive type drain region is disposed on an opposite side of the second conductive type source region via one of the first conductive type gate regions.

Alternatively, each of the first conductive type channel JFET and the second conductive type channel JFET may be an enhancement type JFET. The first conductive type drain region of the first conductive type channel JFET is coupled with the second conductive type drain region of the second conductive type channel JFET, and the second conductive type gate region of the first conductive type channel JFET is coupled with the first conductive gate region of the second conductive type channel JFET.

Alternatively, an impurity concentration of the insulation separation layer may be in a range between $1 \times 10^{11}$ cm$^{-3}$ and $1 \times 10^{14}$ cm$^{-3}$.

Alternatively, the insulation separation layer may be disposed between the substrate and the first conductive type SiC layer so that the first conductive type SiC layer is surrounded with the insulation separation layer, or the insulation separation layer may be disposed between the substrate and the second conductive type SiC layer so that the second conductive type SiC layer is surrounded with the insulation separation layer. In this case, electric separation between the first and second conductive type SiC layers is surely performed.

Alternatively, the insulation separation layer may be made from a part of the substrate.

According to a second aspect of the present disclosure, a manufacturing method of the SiC semiconductor device according to the first aspect of the present disclosure includes: forming an isolation structure such that the first conductive type SiC layer is isolated from the second conductive type SIC layer. The forming of the isolation structure includes: forming the first conductive type SiC layer on the first surface of the substrate; etching a part of the first conductive type SiC layer, which is disposed at an insulation-separation-layer-to-be-formed region and a second-conductive-type-SIC-layer-to-be-formed region, so that a trench is formed; depositing the insulation separation layer on a surface of the first conductive type SiC layer and an inner wall of the trench; forming the second conductive type SiC layer on a surface of the insulation separation layer; and flattening the second conductive type SiC layer and the insulation separation layer until the first conductive type SiC layer is exposed from the second conductive type SiC layer and the insulation separation layer.

In the above method, the insulation separation layer isolates the first conductive type SIC layer from the second conductive type SiC layer, so that an electric element in the complementary junction field effect transistor is formed on a flat surface of the substrate. The manufacturing method of the device is simplified. Further, the insulation separation layer is made of an intrinsic SiC layer having the semi-insulating property instead of a PN junction separation, and therefore, high frequency noise is absorbed in the insulation separation layer so that noise propagation at high frequency is restricted. Further, current leakage at high temperature is restricted.

According to a third aspect of the present disclosure, a manufacturing method of the SiC semiconductor device according to the first aspect of the present disclosure includes:

forming an isolation structure such that the first conductive type SiC layer is isolated from the second conductive type SiC layer. The forming of the isolation structure includes: forming a trench on the first surface of the substrate at a first-conductive-type-SIC-layer-to-be-formed region; forming the first conductive type SiC layer on the first surface of the substrate and an inner wall of the trench; flattening the first conductive type SiC layer until the first conductive type SiC layer is disposed only in the trench; and implanting an ion on the first surface of the substrate at a second-conductive-type-SiC-layer-to-be-formed region so that the second conductive type SiC layer is formed in a part of the substrate, and another part of the substrate between the first conductive type SiC layer and the second conductive type SIC layer remains without implanting the ion. The another part of the substrate provides the insulation separation layer.

In the above method, the insulation separation layer isolates the first conductive type SIC layer from the second conductive type SiC layer, so that an electric element in the complementary junction field effect transistor is formed on a flat surface of the substrate. The manufacturing method of the device is simplified. Further, the insulation separation layer is made of an intrinsic SiC layer having the semi-insulating property instead of a PN junction separation, and therefore, high frequency noise is absorbed in the insulation separation layer so that noise propagation at high frequency is restricted. Further, current leakage at high temperature is restricted.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A SiC semiconductor device comprising:
   a SiC substrate made of intrinsic SiC having semi-insulating property and including a first surface;
   a first conductive type SiC layer disposed in a surface portion of the substrate on the first surface;
   a second conductive type SiC layer disposed in another surface portion of the substrate on the first surface;
   an insulation separation layer made of intrinsic SiC for isolating the first conductive type SiC layer from the second conductive type SiC layer,
      wherein the insulation separation layer is part of the substrate,
      wherein the insulation separation layer and another part of the substrate other than the insulation separation layer are made of a same type of SiC;
   a first conductive type channel JFET disposed in one of the first conductive type SiC layer and the second conductive type SiC layer; and
   a second conductive type channel JFET disposed in the other of the first conductive type SiC layer and the second conductive type SiC layer,
   wherein the first conductive type channel JFET and the second conductive type channel JFET provide a complementary junction field effect transistor,
   wherein the insulation separation layer has a box shape, wherein the uppermost surface of the box shape is open, and
   wherein the second conductive type SiC layer is disposed entirely within the insulation separation layer in the box shape so that the second conductive type SiC layer is insulated, by the insulation separation layer in the box shape, from the first conductive type SiC layer and the SiC substrate.

2. The SIC semiconductor device according to claim 1,
   wherein the first conductive type channel JFET includes:
      a first conductive type source region disposed in a first surface portion of the first conductive type SiC layer and having an impurity concentration higher than the first conductive type SiC layer;
      a first conductive type drain region disposed in a second surface portion of the first conductive type SiC layer and having an impurity concentration higher than the first conductive type SiC layer;
      a pair of second conductive type gate regions spaced apart from each other and disposed in third and fourth surface portions of the first conductive type SiC layer;
      a first gate electrode electrically coupled with the pair of second conductive type gate regions;
      a first source electrode electrically coupled with the first conductive type source region; and
      a first drain electrode electrically coupled with the first conductive type drain region,
   wherein the first conductive type source region is sandwiched between the pair of second conductive type gate regions,
   wherein the first conductive type drain region is disposed on an opposite side of the first conductive type source region via one of the second conductive type gate regions,
   wherein the second conductive type channel JFET includes:
      a second conductive type source region disposed in a first surface portion of the second conductive type SiC layer and having an impurity concentration higher than the second conductive type SiC layer;
      a second conductive type drain region disposed in a second surface portion of the second conductive type SiC layer and having an impurity concentration higher than the second conductive type SiC layer;
      a pair of first conductive type gate regions spaced apart from each other and disposed in third and fourth surface portions of the second conductive type SiC layer;
      a second gate electrode electrically coupled with the pair of first conductive type gate regions;
      a second source electrode electrically coupled with the second conductive type source region; and
      a second drain electrode electrically coupled with the second conductive type drain region,
   wherein the second conductive type source region is sandwiched between the pair of first conductive type gate regions, and
   wherein the second conductive type drain region is disposed on an opposite side of the second conductive type source region via one of the first conductive type gate regions.

3. The SiC semiconductor device according to claim 1,
   wherein each of the first conductive type channel JFET and the second conductive type channel JFET is an enhancement type JFET,
   wherein the first conductive type drain region of the first conductive type channel JFET is coupled with the second conductive type drain region of the second conductive type channel JFET, and
   wherein the second conductive type gate region of the first conductive type channel JFET is coupled with the first conductive gate region of the second conductive type channel JFET.

4. The SiC semiconductor device according to claim 1, wherein an impurity concentration of the insulation separation layer is in a range between $1\times10^{11}$ cm$^{-3}$ and $1\times10^{14}$ cm$^{-3}$.

5. The SiC semiconductor device according to claim 1, wherein the first conductive type channel JFET includes:
- a first conductive type channel layer disposed in a surface portion of the second conductive type SiC layer;
- a second conductive type contact region disposed in another surface portion of the second conductive type SiC layer and having an impurity concentration higher than the second conductive type SiC layer;
- a first conductive type source region and a first conductive type drain region, which are spaced apart from each other, and disposed in first and second surface portions of the first conductive type channel layer in such a manner that the first conductive type source region and the first conductive type drain region sandwich at least a part of the first conductive type channel layer, each of the first conductive type source region and the first conductive type drain region having an impurity concentration higher than the first conductive type channel layer;
- a second conductive type gate region disposed in a third surface portion of the first conductive type channel layer between the first conductive type source region and the first conductive type drain region;
- a first gate electrode electrically coupled with the second conductive type gate region;
- a first source electrode electrically coupled with the first conductive type source region;
- a first drain electrode electrically coupled with the first conductive type drain region; and
- a first back gate electrode electrically coupled with the second conductive type contact region, and wherein the second conductive type channel JFET includes:
- a second conductive type channel layer disposed in a surface portion of the first conductive type SiC layer;
- a first conductive type contact region disposed in another surface portion of the first conductive type SiC layer and having an impurity concentration higher than the first conductive type SiC layer;
- a second conductive type source region and a second conductive type drain region, which are spaced apart from each other, and disposed in first and second surface portions of the second conductive type channel layer in such a manner that the second conductive type source region and the second conductive type drain region sandwich at least a part of the second conductive type channel layer, each of the second conductive type source region and the second conductive type drain region having an impurity concentration higher than the second conductive type channel layer;
- a first conductive type gate region disposed in a third surface portion of the second conductive type channel layer between the second conductive type source region and the second conductive type drain region;
- a second gate electrode electrically coupled with the first conductive type gate region;
- a second source electrode electrically coupled with the second conductive type source region;
- a second drain electrode electrically coupled with the second conductive type drain region; and
- a second back gate electrode electrically coupled with the first conductive type contact region.

6. The SiC semiconductor device according to claim 5, wherein the first source electrode and the first back gate electrode are common, and
wherein the second source electrode and the second back gate electrode are common.

7. The SiC semiconductor device according to claim 5, wherein the first conductive type source region and the first conductive type drain region have a stripe pattern along with a second direction in parallel to the first surface of the substrate,
wherein the second conductive type gate region is divided into two parts in the second direction,
wherein a part of the second conductive type SiC layer sandwiched between the two parts of the second conductive type gate region provides a channel region,
wherein the second conductive type source region and the second conductive type drain region have a stripe pattern along with the second direction,
wherein the first conductive type gate region is divided into two parts in the second direction, and
wherein a part of the first conductive type SiC layer sandwiched between the two parts of the first conductive type gate region provides a channel region.

* * * * *